(12) United States Patent
Shiobara et al.

(10) Patent No.: US 12,336,311 B2
(45) Date of Patent: *Jun. 17, 2025

(54) PHOTOELECTRIC CONVERSION ELEMENT, IMAGE PICKUP ELEMENT, AND IMAGE PICKUP APPARATUS

(71) Applicant: CANON KABUSHIKI KAISHA, Tokyo (JP)

(72) Inventors: Satoru Shiobara, Hiratsuka (JP); Naoki Yamada, Inagi (JP); Tetsuo Takahashi, Kawasaki (JP); Jun Kamatani, Tokyo (JP); Yosuke Nishide, Kawasaki (JP); Hirokazu Miyashita, Ebina (JP); Tomona Yamaguchi, Tokyo (JP); Hironobu Iwawaki, Yokohama (JP); Hiroki Ohrui, Kawasaki (JP); Norifumi Kajimoto, Zama (JP); Masumi Itabashi, Yamato (JP); Kentaro Ito, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 441 days.

This patent is subject to a terminal disclaimer.

(21) Appl. No.: 16/407,012

(22) Filed: May 8, 2019

(65) Prior Publication Data

US 2019/0267411 A1 Aug. 29, 2019

Related U.S. Application Data

(63) Continuation of application No. PCT/JP2017/039722, filed on Nov. 2, 2017.

(30) Foreign Application Priority Data

Nov. 11, 2016 (JP) .................................. 2016-220717
Sep. 15, 2017 (JP) .................................. 2017-177880

(51) Int. Cl.
*H10F 39/12* (2025.01)
*H04N 25/63* (2023.01)
(Continued)

(52) U.S. Cl.
CPC ............. *H10F 39/12* (2025.01); *H04N 25/63* (2023.01); *H10F 30/223* (2025.01); *H10K 30/00* (2023.02);
(Continued)

(58) Field of Classification Search
CPC ............... H01L 51/4253; H01L 51/424; H01L 51/42–448; H10F 39/12
See application file for complete search history.

(56) References Cited

U.S. PATENT DOCUMENTS 6,300,612 B1 * 10/2001 Yu .......................... B82Y 10/00
250/214.1
6,303,943 B1 * 10/2001 Yu .......................... B82Y 10/00
257/40

(Continued)

FOREIGN PATENT DOCUMENTS

| CN | 1295721 A | 5/2001 |
| CN | 1296645 A | 5/2001 |

(Continued)

OTHER PUBLICATIONS

Galano et al. ("Reactivity of silicon and germanium doped CNTs toward aromatic sulfur compounds: A theoretical approach"), Chemical Physics 345 (2008) 87-94.*

(Continued)

*Primary Examiner* — Sadie White
(74) *Attorney, Agent, or Firm* — Canon U.S.A., Inc. IP Division

(57) ABSTRACT

A photoelectric conversion element including an anode, a cathode, and a photoelectric conversion layer, wherein the
(Continued)

photoelectric conversion layer contains a first organic compound and a second organic compound, and difference between oxidation potential of first organic compound and reduction potential of second organic compound is larger than 1.5 [V], and the first organic compound is any one of general formulae [1] below, a fluoranthene derivative, and a metal complex,

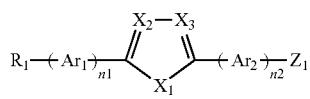

[1]

$R_1$ represents a hydrogen atom or a substituent, $Ar_1$, $Ar_2$, and $Z_1$ represents a substituent, $n_1$ and $n_2$ represents an integer of 0 to 4, and $X_1$ to $X_3$ represents a nitrogen atom, a sulfur atom, an oxygen atom, or a carbon atom.

13 Claims, 7 Drawing Sheets

(51) Int. Cl.
| H10F 30/223 | (2025.01) |
| H10K 30/00 | (2023.01) |
| H10K 30/20 | (2023.01) |
| H10K 39/00 | (2023.01) |
| H10K 39/32 | (2023.01) |
| H10K 85/30 | (2023.01) |
| H10K 99/00 | (2023.01) |

(52) U.S. Cl.
CPC ............ H10K 30/20 (2023.02); H10K 39/00 (2023.02); H10K 39/32 (2023.02); H10K 85/311 (2023.02); H10K 99/00 (2023.02); Y02E 10/549 (2013.01)

(56) References Cited

U.S. PATENT DOCUMENTS

| 2003/0157016 | A1* | 8/2003 | Bolskar | B82Y 30/00 423/445 B |
| 2005/0110007 | A1 | 5/2005 | Forrest | |
| 2008/0055443 | A1* | 3/2008 | Okamoto | H04N 25/17 348/E3.016 |
| 2008/0164460 | A1* | 7/2008 | Oyamada | H10K 50/805 257/E51.001 |
| 2010/0148216 | A1 | 6/2010 | Nakaji | |
| 2010/0163737 | A1 | 7/2010 | Masuda et al. | |
| 2011/0036406 | A1* | 2/2011 | Okubo | B82Y 10/00 977/734 |
| 2012/0175597 | A1* | 7/2012 | Kim | B82Y 10/00 257/40 |
| 2012/0261649 | A1* | 10/2012 | Kim | H01L 51/0043 257/E51.026 |
| 2014/0158859 | A1* | 6/2014 | Fukuzaki | C09B 57/001 250/200 |
| 2016/0190188 | A1* | 6/2016 | Murakami | H01L 27/14643 250/214 A |

FOREIGN PATENT DOCUMENTS

| CN | 101069298 A | 11/2007 |
| CN | 102316264 A | 1/2012 |
| CN | 102447067 A | 5/2012 |
| CN | 104221369 A | 12/2014 |
| CN | 105742303 A | 7/2016 |
| EP | 3466937 A1 | 4/2019 |
| FR | 3011548 A1 | 4/2015 |
| JP | 2001-64640 A | 3/2001 |
| JP | 2007-088033 A | 4/2007 |
| JP | 2009-290091 A | 12/2009 |
| JP | 2010-147158 A | 7/2010 |
| JP | 2010-183060 A | 8/2010 |
| JP | 2010-219212 A | 9/2010 |
| JP | 2011-77198 A | 4/2011 |
| JP | 2012-188355 A | 10/2012 |
| JP | 2017-143133 A | 8/2017 |
| JP | 2017-214353 A | 12/2017 |
| TW | 201419511 A | 5/2014 |
| WO | WO-2014051007 A1 * | 4/2014 | ......... C09B 23/0058 |

OTHER PUBLICATIONS

Shirai et al. ("Fullerene/Thiol-Terminated Molecules"), J. Org. Chem. 2009, 74, 7885-7897.*
Jeux et al. ("Push-Pull Triphenylamine Chromophore Syntheses and Optoelectronic Characterizations"); ChemPlusChem 2015, 80, 697-703.*
Han et al. ("Narrow-Band Organic Photodiodes for High-Resolution Imaging"); ACS Appl. Mater. Interfaces 2016, 8, 26143-26151.*
Lee, et al. "Push-pull organic semiconductors with planar indenothiophene bridges for solution-processed small-molecule organic solar cells." Tetrahedron 70.36 (2014): 6235-6240.*
Perez, et al. "Molecular and morphological influences on the open circuit voltages of organic photovoltaic devices." Journal of the American Chemical Society 131.26 (2009): 9281-9286.*
Hong, et al., Chem. Mater. 2001, 13, 4686-4691 (Year: 2001).*
Mushrush, et al., JACS 2003, 125, 9414-9423 (Year: 2003).*
Yamashita, et al., Science and Technology of Advanced Materials, 2009, 10, 024313 (Year: 2009).*
Tang, et al., Advanced Functional Materials, 2018, 2, 1704507 (Year: 2018).*
Supplemental information for Tang, et al., Advanced Functional Materials, 2018, 2, 1704507 (Year: 2018).*
Brusso, et al., Chem. Mater. 2008, 20, 2484-2494 (Year: 2008).*
Lim (Year: 2013).*
Chou (Year: 2014).*
Leliege (Year: 2013).*
Masaya Hirade, et al.; Effects of Intramolecular Donor—Acceptor Interactions on Bimolecular Recombination in Small-Molecule Organic Photovoltaic Cells; The Journal of Physical Chemistry C; 2013, 117; 4986-4991.
Thomas D. Anthopoulos, et al.; Ambipolar Organic Field-Effect Transistors Based on a Solution-Processed Methanofullerene**; Advanced Materials, 2004, 16, No. 23-24; 2174-2179.
Zhen-Yuan Xia, et al.; "Multifunctional Diarylamine-Substituted Benzo[k]fluoranthene Derivatives as Green Electroluminescent Emitters and Nonlinear Optical Materials;" J. Phys. Chem. C.; vol. 114, No. 26, 2010; 11602-11606.
Heejoo Kim et al.; "Origin of the Open Circuit Voltage in Conjugated Polymer-Fullerene Photovoltaic Cells;" Proceedings of SPIE, vol. 5215, 2004; 111-118.
Zhihua Xu, et al.; "Improvement of Photovoltaic Response based on Enhancement of Spin-Orbital Coupling and Triplet States in Organic Solar Cells;" Journal of Applied Physics, vol. 103, 2008; 043909-1--043909-8.
Guilin Liu et al.; "Photo-Electrochemical Water Splitting System with Three-Layer n-type Organic Semiconductor Film as Photoanode under Visible Irradiation;" Science China Chemistry, Sep. 2012, Vo. 55, No. 9; 1953-1958.
Pasquale Morvillo et al.; "Bisadducts of C70 as Electron Acceptors for Bulk Heterojunction Solar Cells: a Theoretical Study;" Fullerenes, Nanotubes, and Carbon Nanostructures, 19, 410-420, 2011.
Zhang, M., et al., "Downwards tuning the HOMO level of polythiophene by carboxylate substitution for high open-circuit-voltage polymer solar cells", Polym. Chem., 2011, pp. 2900-2906, No. 2.
Al-Ibrahim, M., et al., "The influence of the optoelectronics properties of poly(3-alkylthiophenes) on the device parameters in flexible polymer solar cells", Organic Electronics, Apr. 1, 2005.

(56) References Cited

OTHER PUBLICATIONS

Jaclyn L. Brusso, et al.; "Two-Dimensional Structural Motif in Thienoacene Semiconductors: Synthesis, Structure, and Properties of Tetrathienoanthracene Isomers;" Chem. Mater., vol. 20, No. 7, 2008, pp. 2484-2494.

* cited by examiner

PHOTOELECTRIC CONVERSION ELEMENT, IMAGE PICKUP ELEMENT, AND IMAGE PICKUP APPARATUS

CROSS-REFERENCE TO RELATED APPLICATIONS

This application is a Continuation of International Patent Application No. PCT/JP2017/039722, filed Nov. 2, 2017, which claims the benefit of Japanese Patent Application No. 2016-220717, filed Nov. 11, 2016 and No. 2017-177880, filed Sep. 15, 2017, both of which are hereby incorporated by reference herein in their entirety.

TECHNICAL FIELD

The present invention relates to a photoelectric conversion element, an image pickup element, and an image pickup apparatus.

BACKGROUND ART

In recent years, development of a solid state image pickup element having a structure in which an organic compound is used for a photoelectric conversion layer disposed on a signal-reading substrate has advanced.

Various configurations for improving dark current in a photoelectric conversion element are known. PTL 1 describes an organic photoelectric conversion element, in which an electron-blocking layer is disposed between a photoelectric conversion layer and an anode and in which dark current is reduced by specifying an energy level relationship between the photoelectric conversion layer and the electron-blocking layer and by specifying the layer thickness of the electron-blocking layer.

PTL 2 describes an organic photoelectric conversion element, in which a hole-blocking layer is disposed between a photoelectric conversion layer and a cathode and in which dark current is reduced by specifying an energy level relationship between the photoelectric conversion layer and the hole-blocking layer.

The dark current in the photoelectric conversion element includes dark current generated in the photoelectric conversion layer in addition to current that flows from the anode and from the cathode.

PTLs 1 and 2 neither describe nor indicate dark current that is generated between a p-type organic semiconductor material and an n-type organic semiconductor material in the photoelectric conversion layer. Therefore, a reduction in dark current in the photoelectric conversion element is insufficient.

Accordingly, it is an object of the present invention to provide an organic photoelectric conversion element in which dark current that is generated between a p-type organic semiconductor material and an n-type organic semiconductor material in a photoelectric conversion layer in a photoelectric conversion element is reduced.

CITATION LIST

Patent Literature

PTL 1: Japanese Patent Laid-Open No. 2010-183060
PTL 2: Japanese Patent Laid-Open No. 2007-088033

SUMMARY OF INVENTION

According to an aspect of the present invention, a photoelectric conversion element including an anode, a cathode, and a photoelectric conversion layer disposed between the anode and the cathode is provided, wherein the photoelectric conversion layer contains a first organic compound and a second organic compound, the oxidation potential of the first organic compound is lower than the oxidation potential of the second organic compound, $\Delta E$ denoted by formula (A) below satisfies formula (B) below, $\Delta E$=oxidation potential of first organic compound– reduction potential of second organic compound  (A)

$\Delta E \geq 1.5$ [V]  (B)

and the first organic compound is denoted by any one of general formulae [1] to [5] below.

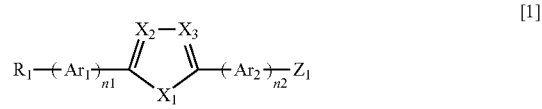

[1]

In general formula [1], $R_1$ represents a hydrogen atom, a halogen atom, a substituted or unsubstituted alkyl group, a substituted or unsubstituted alkoxy group, a substituted or unsubstituted aryl group, a substituted or unsubstituted heterocyclic group, a substituted or unsubstituted vinyl group, a substituted or unsubstituted amino group, or a cyano group.

Each of $n_1$ and $n_2$ represents an integer of 0 to 4, each of $X_1$ to $X_3$ represents a nitrogen atom, a sulfur atom, an oxygen atom, or a carbon atom that may have a substituent.

Each of $Ar_1$ and $Ar_2$ is selected from a substituted or unsubstituted aryl group and a substituted or unsubstituted heterocyclic group.

When a plurality of symbols $Ar_1$ are included, these may be the same or different from each other, when a plurality of symbols $Ar_2$ are included, these may be the same or different from each other, and when $X_2$ or $X_3$ is a carbon atom, $Ar_1$ and $Ar_2$ may form a ring by bonding to each other.

$Z_1$ represents a halogen atom, a cyano group, a substituted or unsubstituted heteroaryl group, or any substituent denoted by general formulae [1-1] to [1-9] below.

In general formulae [1-1] to [1-9], each of $R_{521}$ to $R_{588}$ is selected from a hydrogen atom, a halogen atom, a substituted or unsubstituted alkyl group, a substituted or unsubstituted alkoxy group, a substituted or unsubstituted aryl group, a substituted or unsubstituted heterocyclic group, a substituted or unsubstituted vinyl group, a substituted or unsubstituted amino group, and a cyano group.

[1-1]

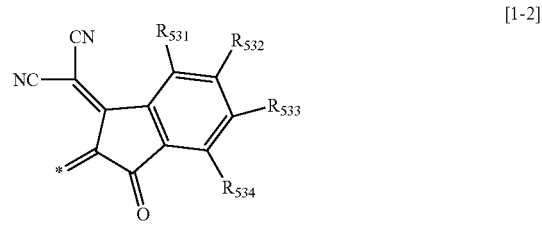

[1-2]

-continued

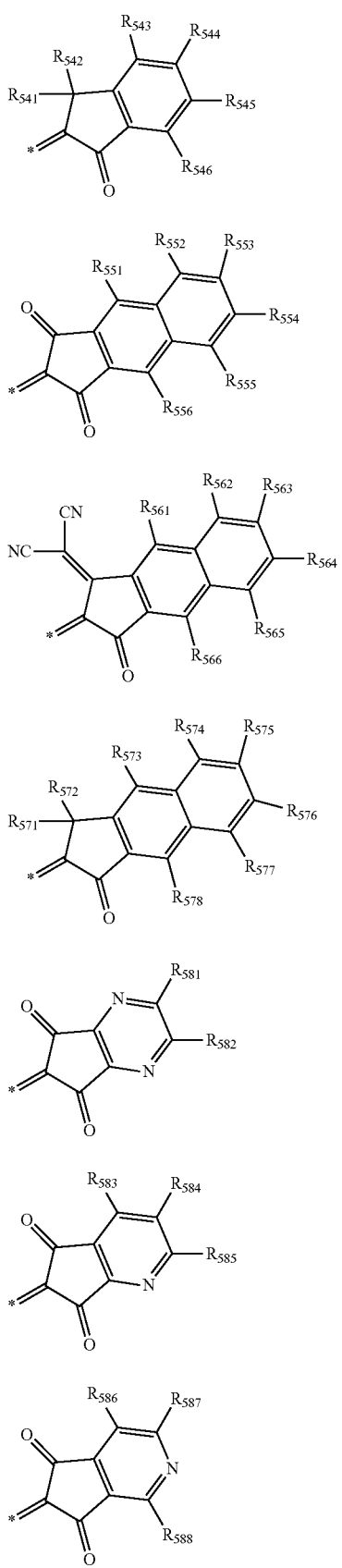

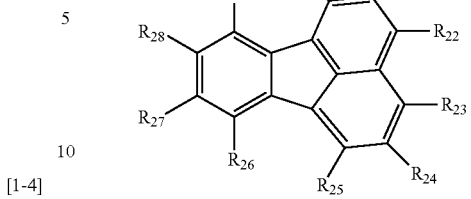

In general formula [2], each of $R_{20}$ to $R_{29}$ is selected from a hydrogen atom, a halogen atom, a substituted or unsubstituted alkyl group, a substituted or unsubstituted alkoxy group, a substituted or unsubstituted aryl group, a substituted or unsubstituted heterocyclic group, a substituted or unsubstituted vinyl group, a substituted or unsubstituted amino group, and a cyano group. Two of $R_{20}$ to $R_{29}$, the two being adjacent to each other, may form a ring by bonding to each other.

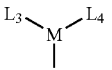

In general formulae [3] to [5], M represents a metal atom. The metal atom may have an oxygen atom or a halogen atom as a substituent.

Each of $L_1$ to $L_9$ represents a ligand that coordinates with the metal M. The ligand is composed of a substituted or unsubstituted aryl group or a substituted or unsubstituted heterocyclic group, and two of $L_1$ to $L_9$, the two being adjacent to each other, may form a ring by bonding to each other.

In addition, according to another aspect of the present invention, a photoelectric conversion element including an anode, a cathode, and a photoelectric conversion layer disposed between the anode and the cathode is provided, wherein the activation energy of dark current is 0.70 eV or more.

Further features of the present invention will become apparent from the following description of exemplary embodiments with reference to the attached drawings.

DESCRIPTION OF EMBODIMENTS

Figure 1:
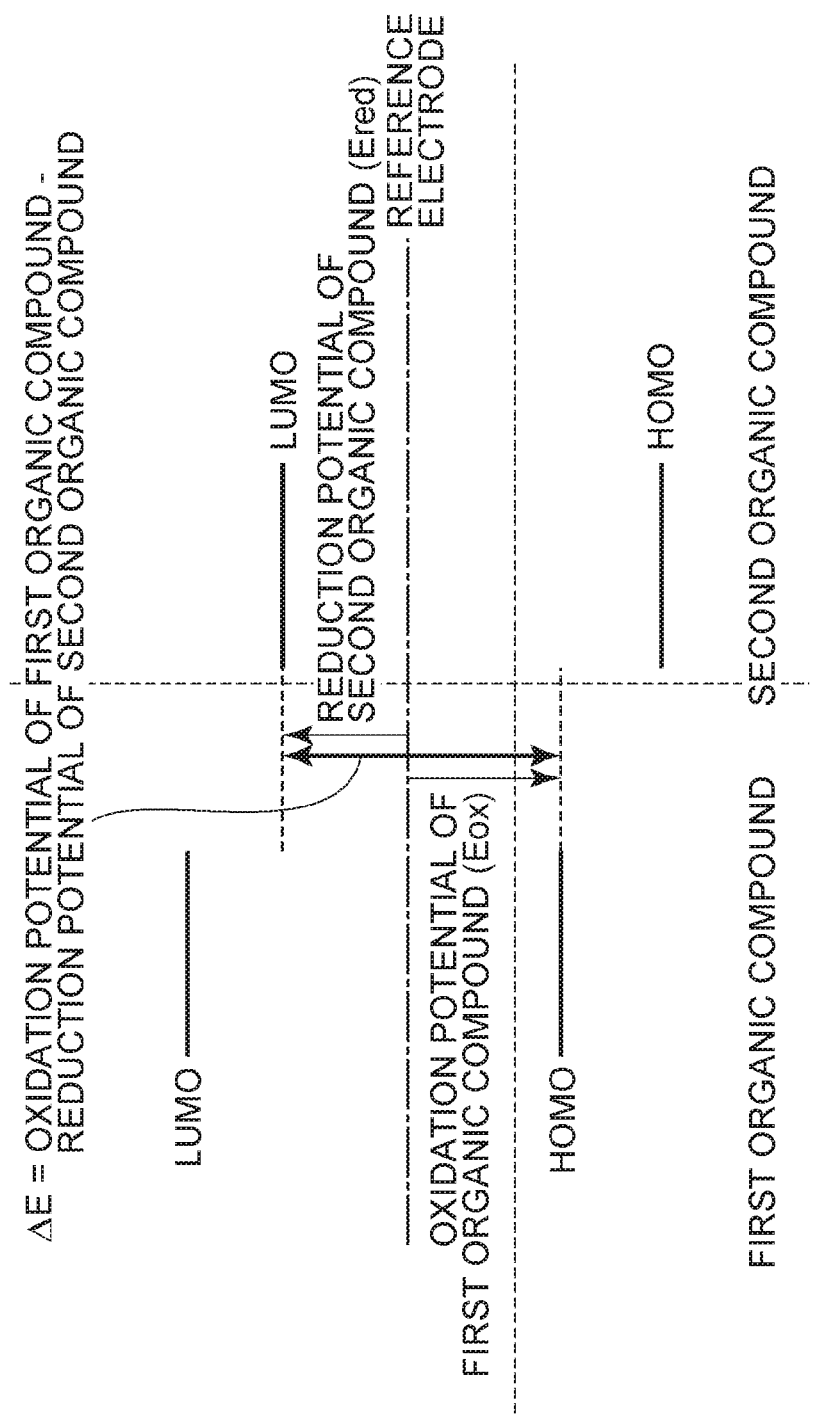
FIG. 1 is an energy diagram showing ΔE according to the present invention.

The present invention relates to a reduction in dark current in a photoelectric conversion element including a photoelectric conversion layer composed of an organic compound. Dark current can be reduced by increasing an energy difference between two types of organic compounds contained in the photoelectric conversion layer to a specific value or more.

Meanwhile, the dark current can be reduced by setting the activation energy of dark current in the photoelectric conversion element to be a specific value or more.

Dark current due to thermal charge separation is not readily generated when the activation energy increases. The activation energy is the magnitude of energy required for exciting the first organic compound and the second organic compound to a charge separation state. Application of energy higher than or equal to the activation energy by the thermal energy causes dark current.

According to an aspect of the present invention, dark current in a photoelectric conversion element is reduced by setting the activation energy of dark current to be 0.70 eV or more. The activation energy of dark current is preferably 0.75 eV or more and further preferably 0.80 eV or more.

Configuration of Photoelectric Conversion Element

In the present embodiment, a photoelectric conversion element including a photoelectric conversion layer composed of an organic compound between an anode and a cathode will be described as an example.

The photoelectric conversion layer included in the photoelectric conversion element according to the present invention is a layer that receives light so as to generate electric charge in accordance with the amount of the light. The function of the photoelectric conversion layer is to perform charge separation into holes and electrons on the basis of light absorption so as to convert the light into electric signals. The photoelectric conversion layer may contain a plurality of types of organic compounds. A layer in which a donor material that carries positive charge into the photoelectric conversion layer and an acceptor material that carries negative charge are mixed at random is called a bulk heterojunction.

When the photoelectric conversion layer contains a plurality of types of organic compounds, the plurality of types of organic compounds may be mixed in one layer, or the plurality of types of organic compounds may be contained in a plurality of layers.

It is preferable that the photoelectric conversion layer be a layer containing a p-type organic semiconductor or an n-type organic semiconductor. It is more preferable that bulk heterolayers in which an organic p-type compound and an organic n-type compound are mixed be included in at least some of the photoelectric conversion layers. In other words, the heterolayer may be a mixed layer.

The photoelectric conversion layer including the bulk heterolayer has high photoelectric conversion efficiency. Further, in the bulk heterolayer having an appropriate mixing ratio, the electron mobility and the hole mobility are high in the photoelectric conversion layer, and the optical response speed of the photoelectric conversion element is high. Therefore, it is preferable that a bulk heterolayer having an optimum mixing ratio be included.

Regarding $\Delta E$ $\Delta E$ is an energy gap defined by formula (A) below.

$$\Delta E = \text{oxidation potential of first organic compound} - \text{reduction potential of second organic compound} \quad \text{(A)}$$

In this regard, $\Delta E$ satisfies formula (B) below.

$$\Delta E \geq 1.5 \,[\text{V}] \quad \text{(B)}$$

FIG. 1 is an energy diagram showing $\Delta E$. The oxidation potential of the first organic compound corresponds to HOMO of the first organic compound. Meanwhile, the reduction potential of the second organic compound corresponds to LUMO of the second organic compound. The oxidation-reduction potential is a potential energy difference between molecules in a solution and an electrode and is a physical property value of the molecule alone.

Dark current may be generated from a p-type organic semiconductor material to an n-type organic semiconductor material due to thermal charge separation. In a sense, $\Delta E$ is energy necessary for generation of dark current due to thermal charge separation.

When formula (B) is satisfied, generation of dark current due to thermal excitation rather than optical excitation can be suppressed.

This is because the magnitude of $\Delta E$ correlates with the activation energy of dark current generation and, more specifically, the activation energy of the dark current tends to increase when $\Delta E$ increases. When formula (B) is satisfied, the activation energy of dark current generation is increased, generation of dark current due to thermal excitation is suppressed, and thereby a photoelectric conversion element in which dark current is reduced can be obtained.

Meanwhile, dark current due to thermal excitation is caused by contact between molecules of a p-type organic semiconductor and molecules of an n-type organic semiconductor, which form a bulk heterojunction.

In addition to formula (B), the activation energy can be increased and dark current can be reduced by the photoelectric conversion layer including an organic compound that is suppressed from coming into contact with other molecules or an organic compound that suppresses generation of thermal electrons.

The photoelectric conversion element according to the present embodiment is a photoelectric conversion element in which dark current is reduced because the photoelectric conversion layer contains the first organic compound and the second organic compound, the first organic compound has a property of suppressing contact with other molecules or a property of suppressing generation of thermal electrons.

The photoelectric conversion layer contains the first organic compound and the second organic compound, and the first organic compound is an electron donor material.

The first organic compound is the p-type organic semiconductor contained in the photoelectric conversion layer. The first organic compound is an organic semiconductor with donor ability and has a property of readily providing electrons. Specifically, of the two organic compounds, the first organic compound is an organic compound having a lower oxidation potential. That is, the first organic compound is an electron donor material, and the second organic compound is an electron acceptor material.

Examples of compounds usable as the first organic compound include a triarylamine compound, a pyran compound, a quinacridone compound, a benzidine compound, a pyrazoline compound, a styrylamine compound, a hydrazone compound, a triphenylmethane compound, a carbazole compound, a polysilane compound, a thiophene compound, a phthalocyanine compound, a cyanine compound, a merocyanine compound, an oxonol compound, a polyamine compound, an indole compound, a pyrrole compound, a pyrazole compound, a polyarylene compound, a fused aromatic carbon ring compound (a naphthalene derivative, an anthracene derivative, a phenanthrene derivative, a tetracene derivative, a pyrene derivative, a perylene derivative, and a fluoranthene derivative), and a metal complex including a nitrogen-containing heterocyclic compound as a ligand. In particular, a triarylamine compound, a pyran compound, a quinacridone compound, a pyrrole compound, a phthalocyanine compound, a merocyanine compound, and a fussed aromatic carbon ring compound are preferable.

The fluoranthene derivative is a compound with a chemical structural formula having a fluoranthene skeleton. A compound in which a fused ring is added to the fluoranthene skeleton is also included. That is, a compound in which the fluoranthene skeleton is present in the chemical structural formula is referred to as the fluoranthene derivative. The same applies to other derivatives, that is, the naphthalene derivative, the anthracene derivative, the phenanthrene derivative, the tetracene derivative, the pyrene derivative, and the perylene derivative.

The first organic compound is preferably within a visible range with an absorption wavelength of 450 nm or more and 700 nm or less. For the purpose of providing the photoelectric conversion layer with a panchromatic absorption band, the absorption peak wavelength is preferably 500 nm or more. In particular, 530 nm or more is preferable, and 530 nm or more and 650 nm or less is further preferable. When the absorption peak wavelength falls within the above-described range, absorption also occurs in a blue range of 450 nm or more and 470 nm or less and a red range of 600 nm or more and 630 nm or less, which are nearby ranges, and as a result, panchromatism is improved.

The absorption peak wavelength can be obtained by, for example, measuring an absorption spectrum in a chloroform solution.

In this regard, when the absorption peak wavelength of the first organic compound is 530 nm or more, it is particularly preferable that formula (B) be satisfied and the activation energy of dark current be set to be a specific value or more.

An organic compound having an absorption peak wavelength of 530 nm or more is an organic compound having a relatively small band gap. Regarding the organic compound having a small band gap, HOMO thereof tends to approach LUMO of the second organic compound. That is, dark current is readily generated. In this case, great effect is exerted by satisfying formula (B) or satisfying that the activation energy of dark current is set to be a specific value or more.

The concentration of the first organic compound in the photoelectric conversion layer is preferably less than 35% by weight, where the total of the first organic compound and the second organic compound is assumed to be 100% by weight, and 27.5% by weight or less is more preferable. It is favorable that the concentration of the first organic compound be within the preferable range because dark current can be further reduced.

The first organic compound is denoted by any one of general formulae [1] to [5] below. It is particularly preferable that the first organic compound be an organic compound denoted by general formula [1].

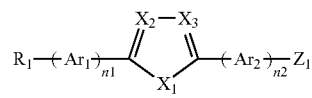

[1]

In general formula [1], $R_1$ represents a hydrogen atom, a halogen atom, a substituted or unsubstituted alkyl group, a substituted or unsubstituted alkoxy group, a substituted or unsubstituted aryl group, a substituted or unsubstituted heterocyclic group, a substituted or unsubstituted vinyl group, a substituted or unsubstituted amino group, or a cyano group.

Each of $n_1$ and $n_2$ represents an integer of 0 to 4.

Each of $X_1$ to $X_3$ represents a nitrogen atom, a sulfur atom, an oxygen atom, or a carbon atom that may have a substituent.

Each of $Ar_1$ and $Ar_2$ is selected from a substituted or unsubstituted aryl group and a substituted or unsubstituted heterocyclic group. When a plurality of symbols $Ar_1$ are included, these may be the same or different from each other, when a plurality of symbols $Ar_2$ are included, these may be the same or different from each other, and when $X_2$ or $X_3$ is a carbon atom, $Ar_1$ and $Ar_2$ may form a ring by bonding to each other.

$Z_1$ represents a halogen atom, a cyano group, a substituted or unsubstituted heteroaryl group, or any substituent denoted by general formulae [1-1] to [1-9] below.

In general formulae [1-1] to [1-9], each of $R_{521}$ to $R_{588}$ is selected from a hydrogen atom, a halogen atom, a substituted or unsubstituted alkyl group, a substituted or unsubstituted alkoxy group, a substituted or unsubstituted aryl group, a substituted or unsubstituted heterocyclic group, a substituted or unsubstituted vinyl group, a substituted or unsubstituted amino group, and a cyano group.

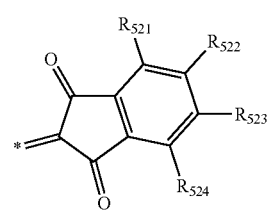

[1-1]

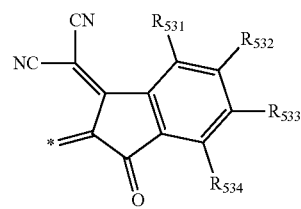

[1-2]

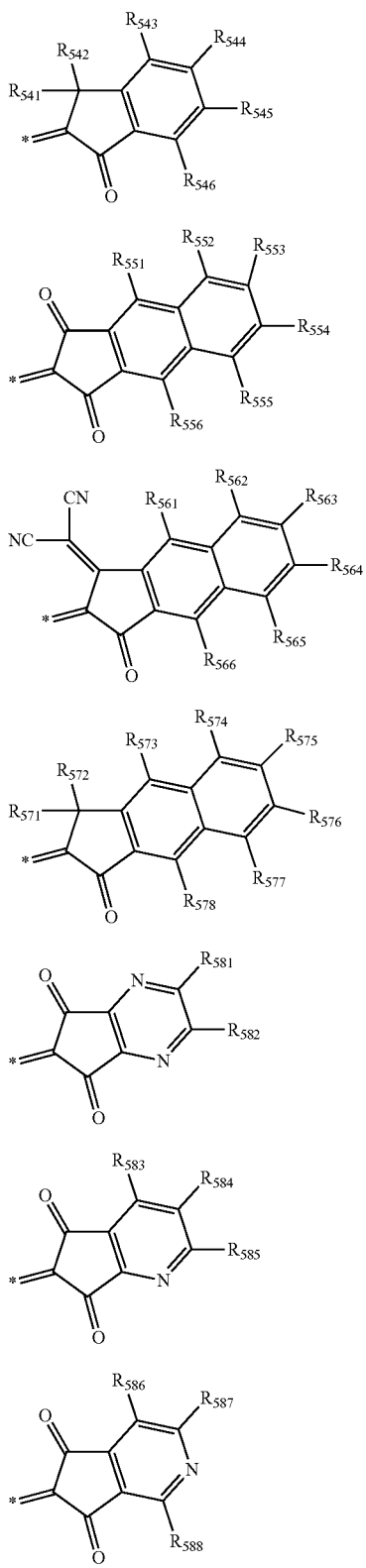

erocyclic group is nitrogen. Preferably, $X_1$ is a sulfur atom or an oxygen atom. Preferably, $n_1$ is 1 and $n_2$ is 0. Since $n_2$ is 0, $Ar_2$ represents a single bond.

The first organic compound may be denoted by general formula [2] below.

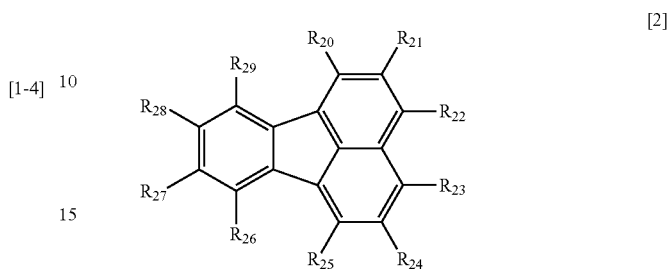

[2]

In general formula [2], each of $R_{20}$ to $R_{29}$ is selected from a hydrogen atom, a halogen atom, a substituted or unsubstituted alkyl group, a substituted or unsubstituted alkoxy group, a substituted or unsubstituted aryl group, a substituted or unsubstituted heterocyclic group, a substituted or unsubstituted vinyl group, a substituted or unsubstituted amino group, and a cyano group. Two of $R_{20}$ to $R_{29}$, the two being adjacent to each other, may form a ring by bonding to each other.

The first organic compound may be denoted by any one of general formulae [3] to [5] below.

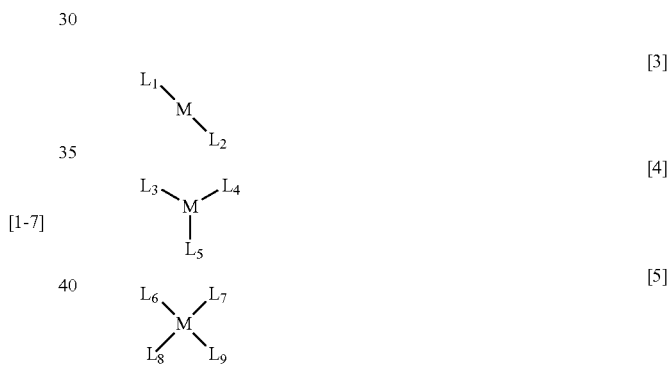

[3]

[4]

[5]

In general formulae [3] to [5], M represents a metal atom. The metal atom may have an oxygen atom or a halogen atom as a substituent.

Each of $L_1$ to $L_9$ represents a ligand that coordinates with the metal M. The ligand is composed of a substituted or unsubstituted aryl group or a substituted or unsubstituted heterocyclic group, and two of $L_1$ to $L_9$, the two being adjacent to each other, may form a ring by bonding to each other.

In this regard, there is no particular limitation regarding a ring structure resulting from ring formation. For example, a five-membered ring may be fused, a six-membered ring may be fused, or a seven-membered ring may be fused. The ring structure of a ring to be fused may be an aromatic ring or an alicyclic ring structure. Hereafter in the present specification, the same applies to "may form a ring", unless otherwise specified.

In general formulae [3] to [5], when M is iridium, a six-coordinate complex is preferable. When M is platinum, vanadium, cobalt, gallium, or titanium, a four-coordinate complex is preferable. This is because adoption of the above-described coordination number enhances stability of the complex.

Regarding the organic compounds denoted by general formula [1], it is preferable that $Ar_1$ be a substituted or unsubstituted aryl group or a substituted or unsubstituted heterocyclic group. Preferably, the heteroatom in the het- More specifically, general formula [2] may be represented by any one of general formulae [11] to [27] below.
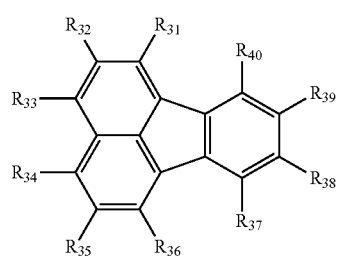
[11]
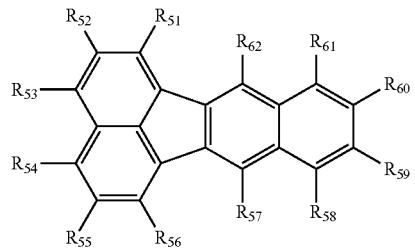
[12]
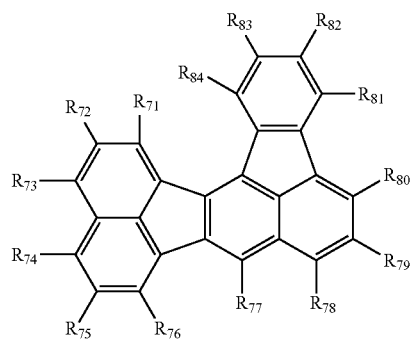
[13]
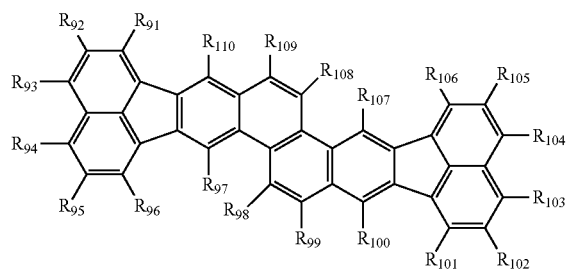
[14]
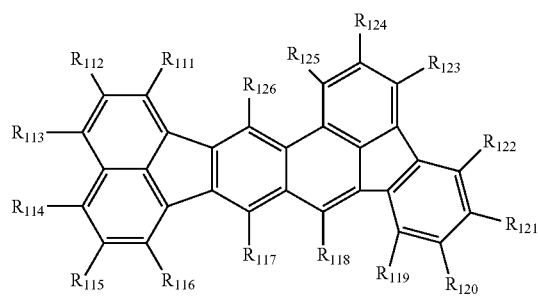
[15]
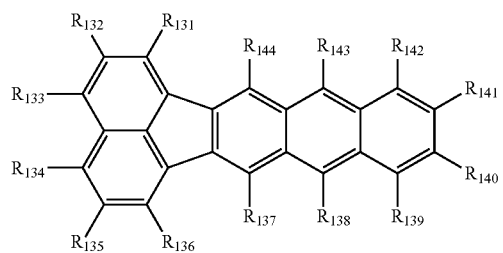
[16]
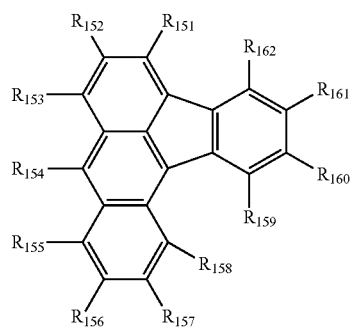
[17]
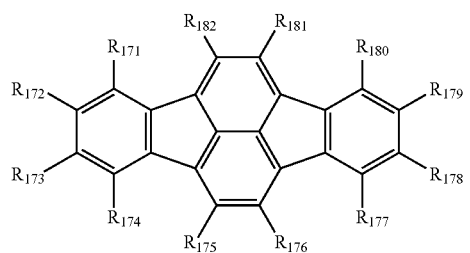
[18]
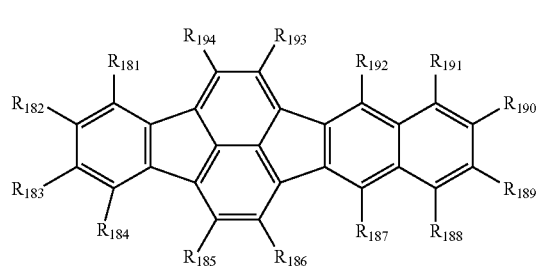
[19]
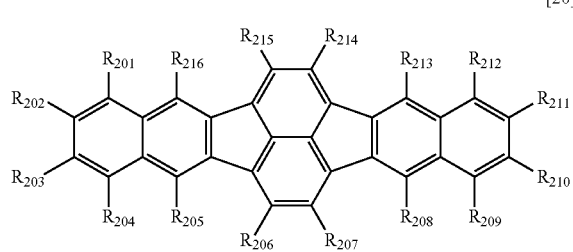
[20]

-continued
[21]
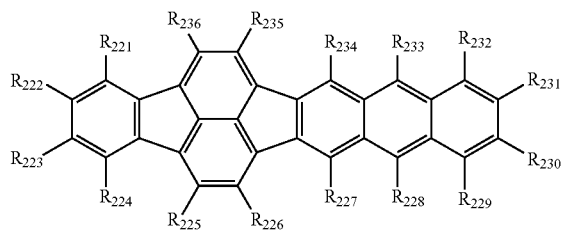
[22]
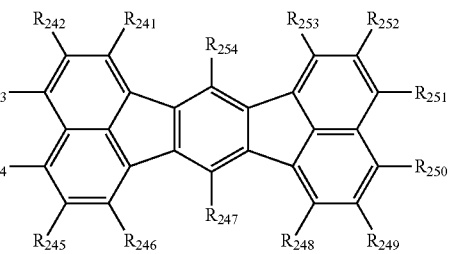
[23]
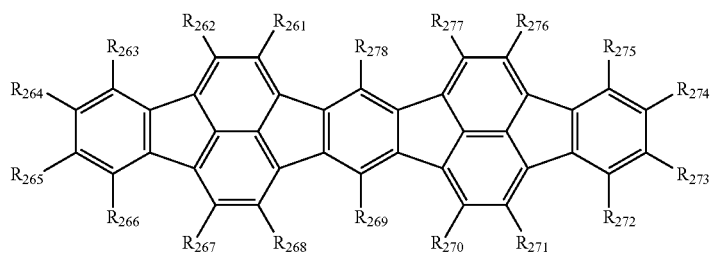
[24]
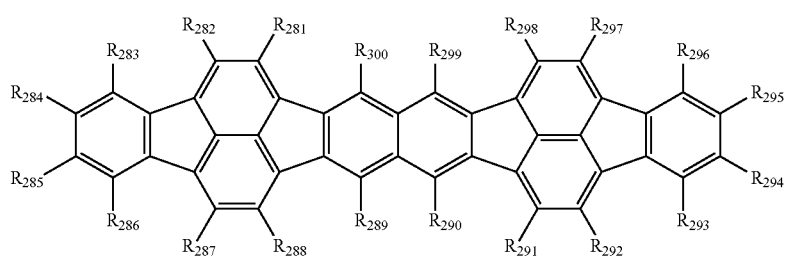
[25]
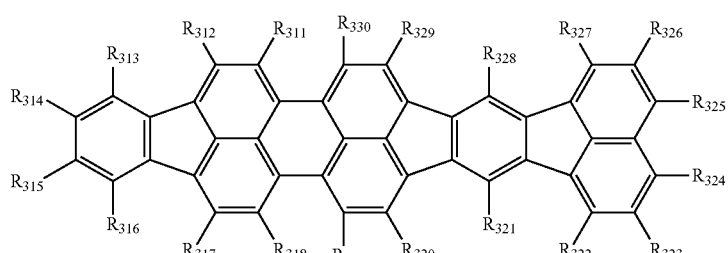
[26]
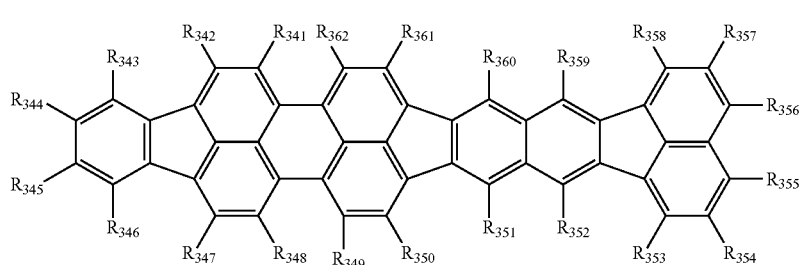
[27]
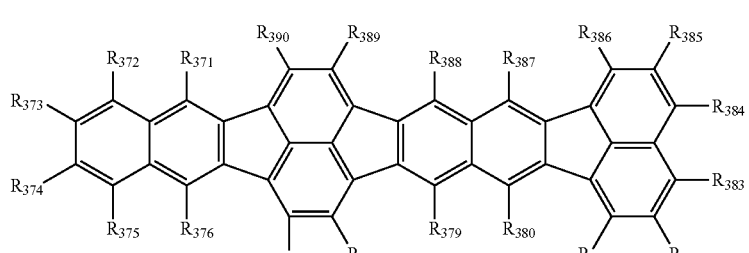

In general formulae [11] to [27], each of $R_{31}$ to $R_{390}$ is selected from a hydrogen atom, a halogen atom, a substituted or unsubstituted alkyl group, a substituted or unsubstituted alkoxy group, a substituted or unsubstituted aryl group, a substituted or unsubstituted heterocyclic group, a substituted or unsubstituted vinyl group, a substituted or unsubstituted amino group, and a cyano group.

Specific examples of substituents in general formulae [1] and [2], general formulae [1-1] to [1-9], and general formulae [11] to [27] are as described below.

The halogen atom is a chlorine atom, a bromine atom, or an iodine atom, and a fluorine atom is preferable.

The alkyl group is preferably an alkyl group having a carbon atom number of 1 to 10. Examples include a methyl group, an ethyl group, a normal propyl group, an isopropyl group, a normal butyl group, a tertiary butyl group, a secondary butyl group, an octyl group, a 1-adamantyl group, and a 2-adamantyl group. The alkyl group may be an alkyl group having a carbon atom number of 1 to 4.

The alkoxy group is preferably an alkoxy group having a carbon atom number of 1 to 10. Examples include a methoxy group, an ethoxy group, a normal propoxy group, an isopropoxy group, a normal butoxy group, a tertiary butoxy group, a secondary butoxy group, and an octoxy group. The alkoxy group may be an alkoxy group having a carbon atom number of 1 to 4.

The aryl group is preferably an aryl group having a carbon atom number of 6 to 20. Examples include a phenyl group, a naphthyl group, an indenyl group, a biphenyl group, a terphenyl group, a fluorenyl group, an anthrathenyl group, a pyrenyl group, a fluoranthenyl group, and a perylenyl group. In particular, a phenyl group, a biphenyl group, a terphenyl group, a fluorenyl group, and a naphthyl group are preferable in consideration of low molecular weight and sublimability of the compound.

The heterocyclic group is preferably a heterocyclic group having a carbon atom number of 3 to 15. Examples include a pyridyl group, a pyrazyl group, a triazyl group, a thienyl group, a furanyl group, a pyrrolyl group, an oxazolyl group, an oxadiazolyl group, a thiazolyl group, a thiadiazolyl group, a carbazolyl group, an acridinyl group, a phenanthrolyl group, a benzothiophenyl group, a dibenzothiophenyl group, a benzothiazolyl group, a benzoxazolyl group, and a benzopyrrolyl group. A heteroatom included in the heterocyclic group is preferably nitrogen.

The amino group is preferably an amino group having an alkyl group or an aryl group as a substituent. Examples include an N-methylamino group, an N,N-dimethylamino group, an N,N-diethylamino group, an N-methyl-N-ethylamino group, an N-benzylamino group, an N-methyl-N-benzylamino group, an N,N-dibenzylamino group, an anilino group, an N,N-diphenylamino group, an N,N-dinaphthylamino group, an N,N-difluorenylamino group, an N-phenyl-N-tolylamino group, an N,N-ditolylamino group, an N-methyl-N-phenylamino group, an N,N-dianisolylamino group, an N-mesityl-N-phenylamino group, an N,N-dimesitylamino group, an N-phenyl-N-(4-tertiary-butylphenyl)amino group, and an N-phenyl-N-(4-trifluoromethylphenyl)amino group. The alkyl group or the aryl group included as a substituent in the amino group is the same as the above-described example of the substituent.

The substituents included in the alkyl group, the aryl group, the heterocyclic group, the amino group, the vinyl group, and the alkoxy group in general formulae [1] and [2], general formulae [1-1] to [1-9], and general formulae [11] to [27] are substituents described below. Examples of the substituent include an alkyl group having a carbon atom number of 1 to 4, for example, a methyl group, an ethyl group, a propyl group, and a butyl group, an aralkyl group, for example, a benzyl group, an aryl group, for example, a phenyl group and a biphenyl group, a heterocyclic group in which a heteroatom is a nitrogen atom, for example, a pyridyl group and a pyrrolyl group, an amino group, for example, a dimethylamino group, a diethylamino group, a dibenzylamino group, a diphenylamino group, and a ditolylamino group, an alkoxy group, for example, a methoxy group, an ethoxy group, a propoxy group, and a phenoxy group, a cyclic ketone group, for example, a 1,3-indanedionyl group, a 5-fluoro-1,3-indanedionyl group, a 5,6-difluoro-1,3-indanedionyl group, a 5,6-dicyano-1,3-indanedionyl group, a 5-cyano-1,3-indanedionyl group, a cyclopenta[b]naphthalene-1,3(2H)-dionyl group, a phenalene-1,3(2H)-dionyl group, and a 1,3-diphenyl-2,4,6(1H,3H,5H)-pyrimidinetrionyl group, a cyano group, and a halogen atom. The halogen atom is fluorine, chlorine, bromine, iodine, or the like and a fluorine atom is preferable.

Specific examples of ligands $L_1$ to $L_9$ in general formulae [3] to [5] are as described below.

The ligands $L_1$ to $L_9$ are ligands in which a plurality of substituents selected from substituted or unsubstituted aryl groups and substituted or unsubstituted heterocyclic groups are bonded.

Examples of the aryl group constituting the ligand include a phenyl group, a naphthyl group, an indenyl group, a biphenyl group, a terphenyl group, a fluorenyl group, an anthrathenyl group, a pyrenyl group, a fluoranthenyl group, and a perylenyl group but are not limited to these, as a matter of course.

Examples of the heterocyclic group constituting the ligand include a pyridyl group, a pyrazyl group, a triazyl group, a thienyl group, a furanyl group, a pyrrolyl group, an oxazolyl group, an oxadiazolyl group, a thiazolyl group, a thiadiazolyl group, a carbazolyl group, an acridinyl group, a phenanthrolyl group, a benzothiophenyl group, a dibenzothiophenyl group, a benzothiazolyl group, a benzoxazolyl group, and a benzopyrrolyl group but are not limited to these.

Examples of the substituent included in the ligand in general formulae [3] to [5], that is, the substituent included in the aryl group or the heterocyclic group, include an alkyl group having a carbon atom number of 1 to 4, for example, a methyl group, an ethyl group, a propyl group, and a butyl group, an aralkyl group, for example, a benzyl group, an aryl group, for example, a phenyl group and a biphenyl group, a heterocyclic group in which a heteroatom is a nitrogen atom, for example, a pyridyl group and a pyrrolyl group, an amino group, for example, a dimethylamino group, a diethylamino group, a dibenzylamino group, a diphenylamino group, and a ditolylamino group, an alkoxy group, for example, a methoxy group, an ethoxy group, a propoxy group, and a phenoxy group, a cyclic ketone group, for example, a 1,3-indanedionyl group, a 5-fluoro-1,3-indanedionyl group, a 5,6-difluoro-1,3-indanedionyl group, a 5,6-dicyano-1,3-indanedionyl group, a 5-cyano-1,3-indanedionyl group, a cyclopenta[b]naphthalene-1,3(2H)-dionyl group, a phenalene-1,3(2H)-dionyl group, and a 1,3-diphenyl-2,4,6(1H,3H,5H)-pyrimidinetrionyl group, a cyano group, and a halogen atom. The halogen atom is fluorine, chlorine, bromine, iodine, or the like and a fluorine atom is preferable.

The ligand may have a hydroxy group, a carboxy group, or the like as a substituent and may be metal-atom-bonded by interposing the hydroxy group or the carboxy group.

It is preferable that general formula [1] have a structure denoted by general formula [28] below.

[28]

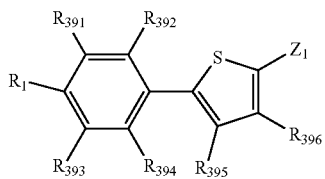

Each of $R_{391}$ to $R_{396}$ is selected from a hydrogen atom, a halogen atom, a substituted or unsubstituted alkyl group, a substituted or unsubstituted alkoxy group, a substituted or unsubstituted aryl group, a substituted or unsubstituted heterocyclic group, a substituted or unsubstituted vinyl group, a substituted or unsubstituted amino group, and a cyano group. Two of $R_{391}$ to $R_{396}$, the two being adjacent to each other, may form a ring by bonding to each other. In particular, it is preferable that $R_{394}$ and $R_{395}$ form a ring by bonding to each other.

In this regard, the organic compound denoted by general formula [28] is a material having strong absorption at an absorption peak wavelength of 522 nm or more and 600 nm or less. It is preferable that an absorption peak appear in this wavelength range because the photoelectric conversion layer has panchromatism, as described above.

Specific examples of the first organic compound are as described below.

1-1

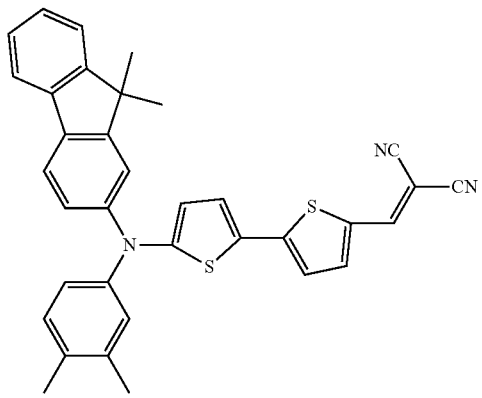

1-2

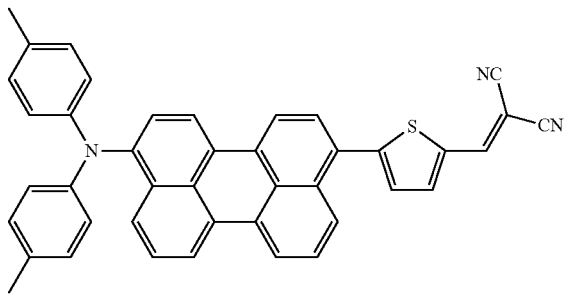

1-3

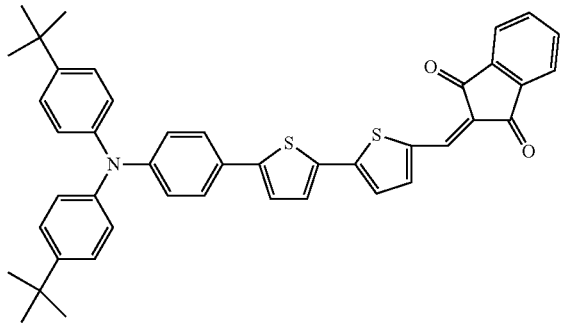

1-4

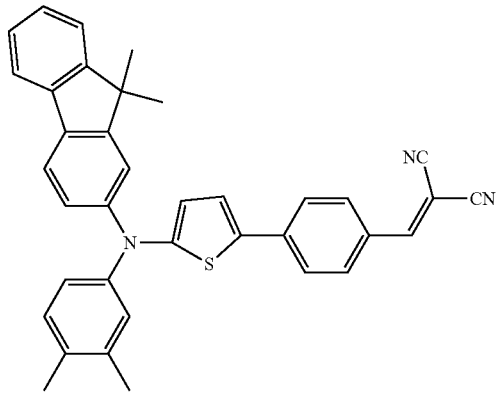

1-5

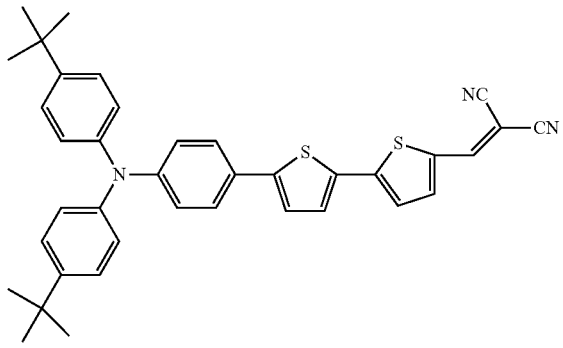

1-6

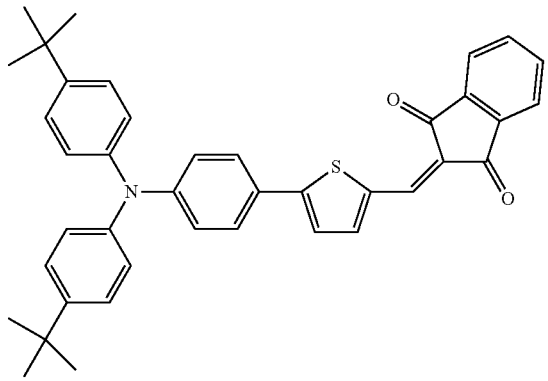

-continued
1-7
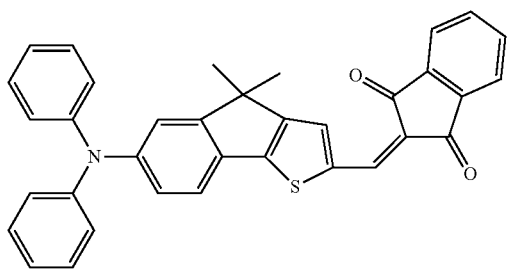
1-8
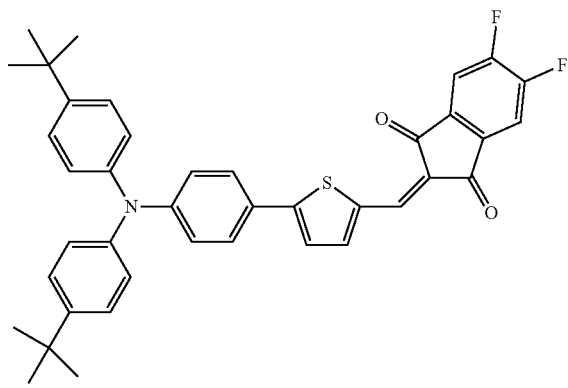
1-9
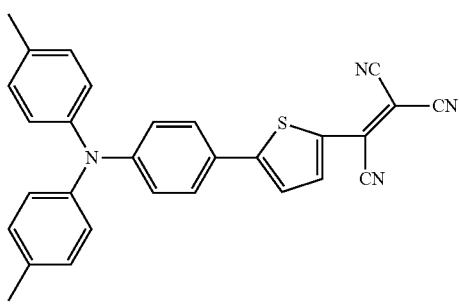
1-10
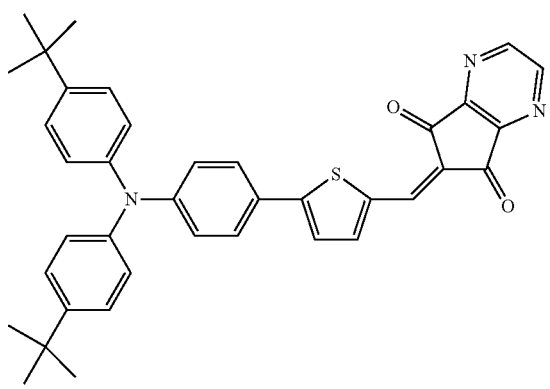
1-11
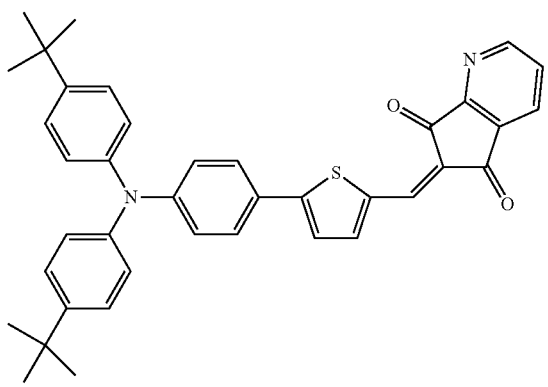
1-12
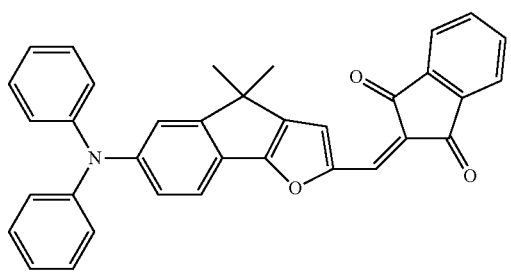
1-13
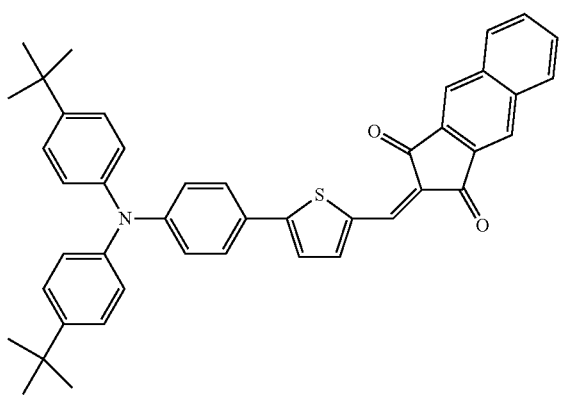
1-14
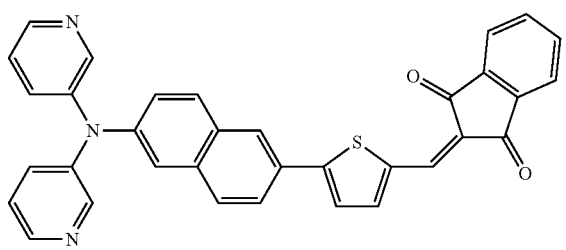

-continued
1-15
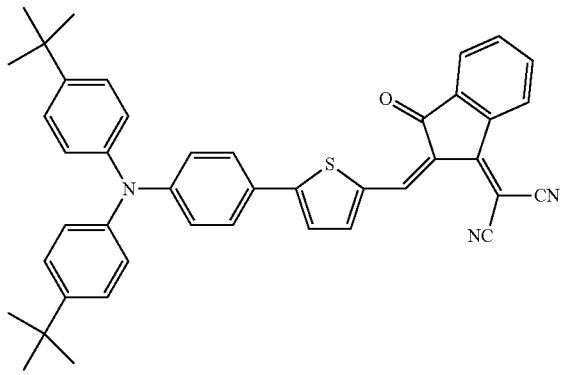
1-16
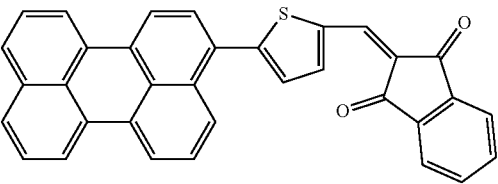
1-17
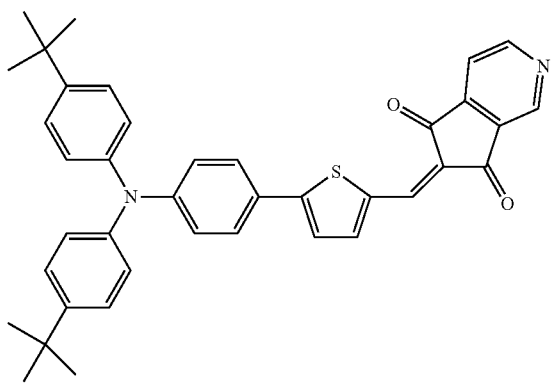
1-18
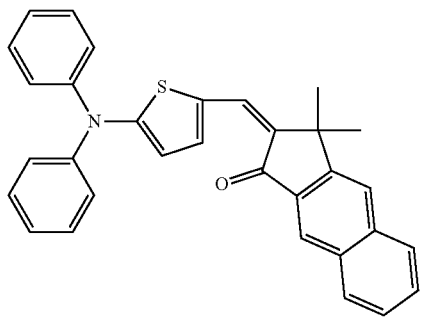
1-19
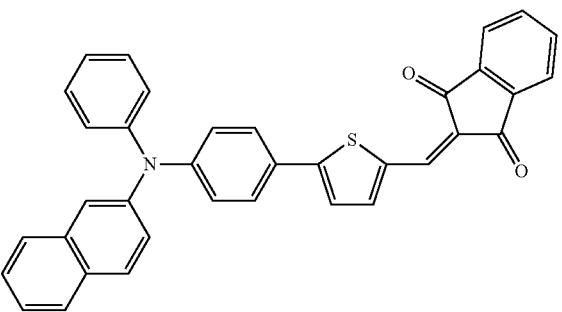
1-20
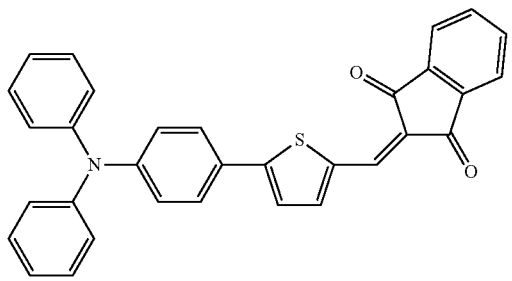
1-21
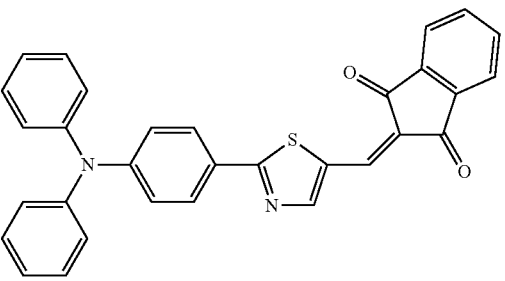
1-22

-continued
1-23
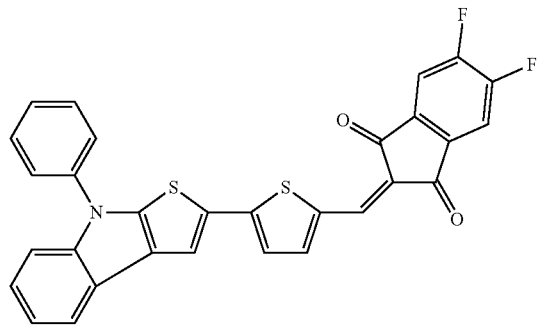
1-24
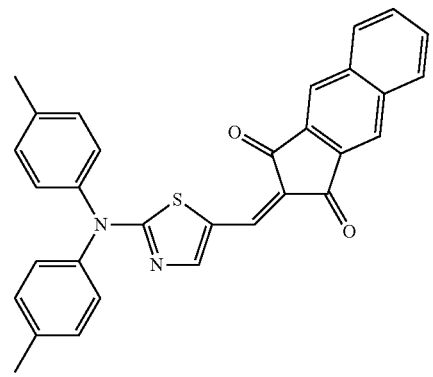
2-1
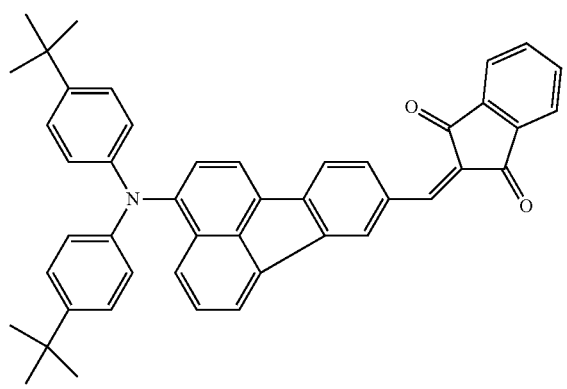
2-2
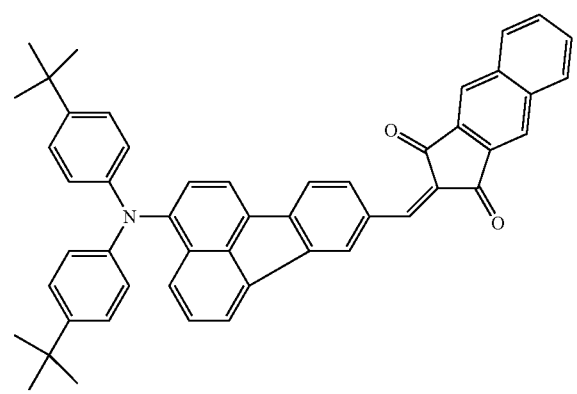
2-3
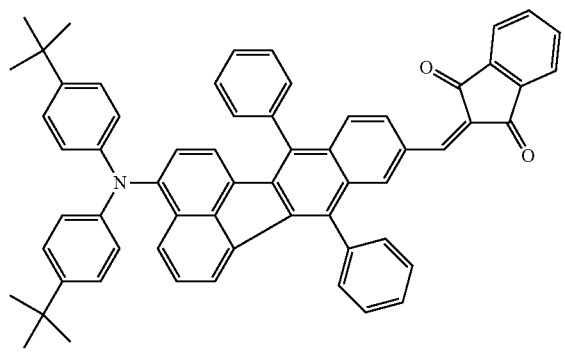
2-4
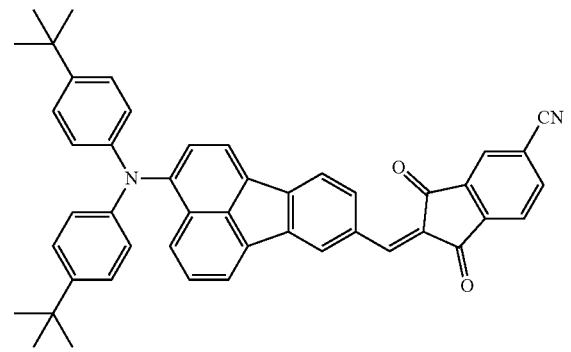
2-5
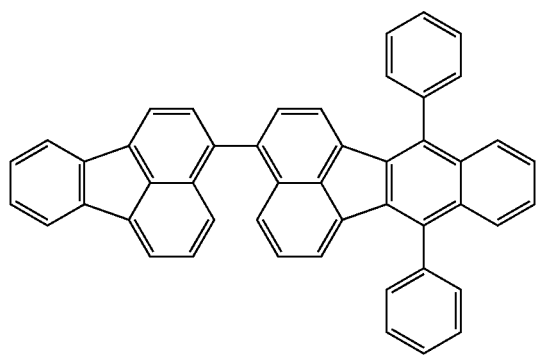
2-6
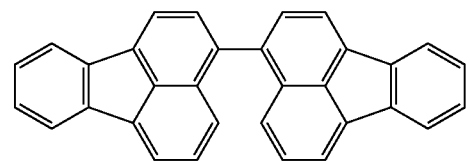

-continued
2-7
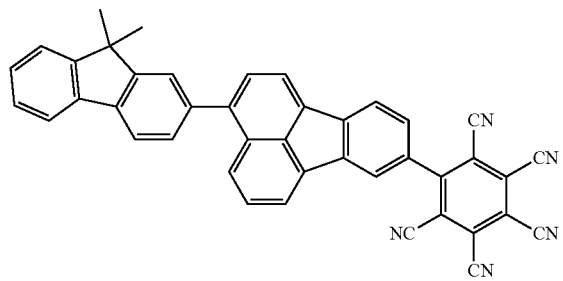
2-8
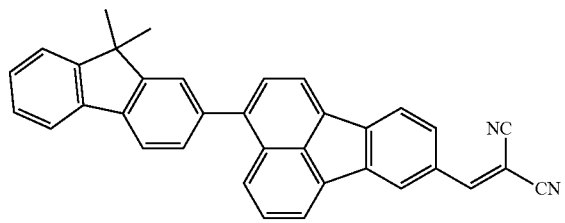
2-9
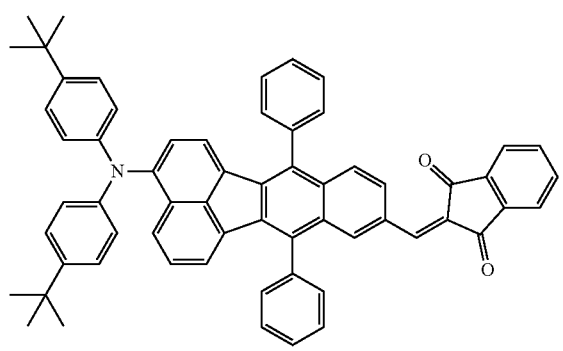
2-10
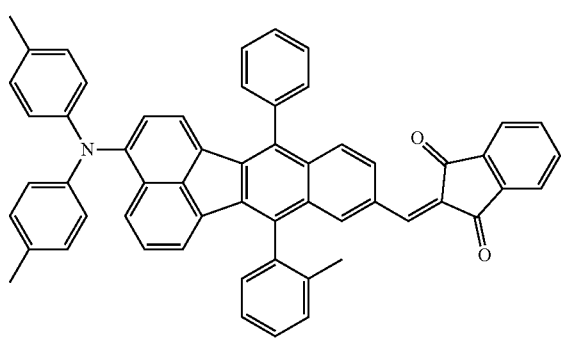
2-11
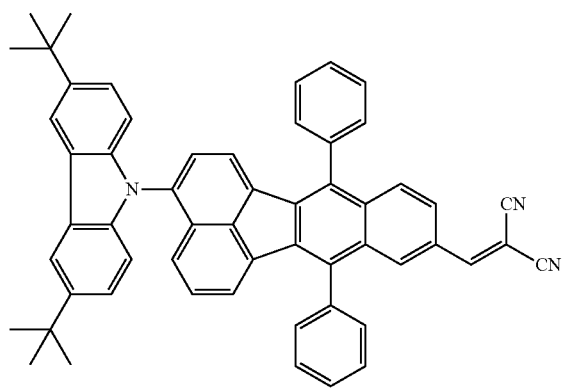
2-12
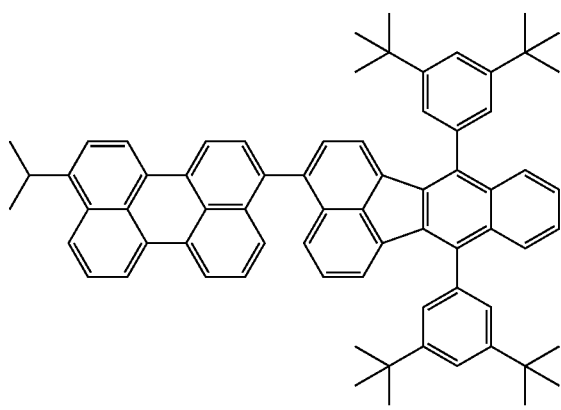
2-13
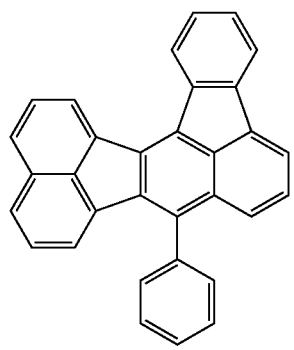
2-14
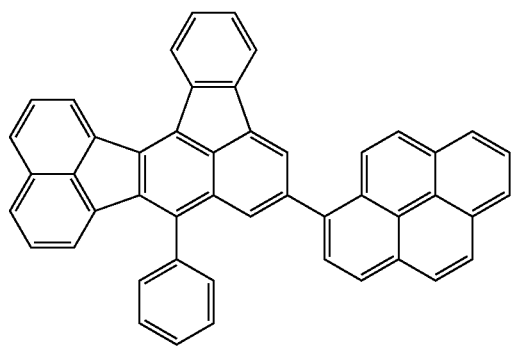

-continued
2-15
2-16
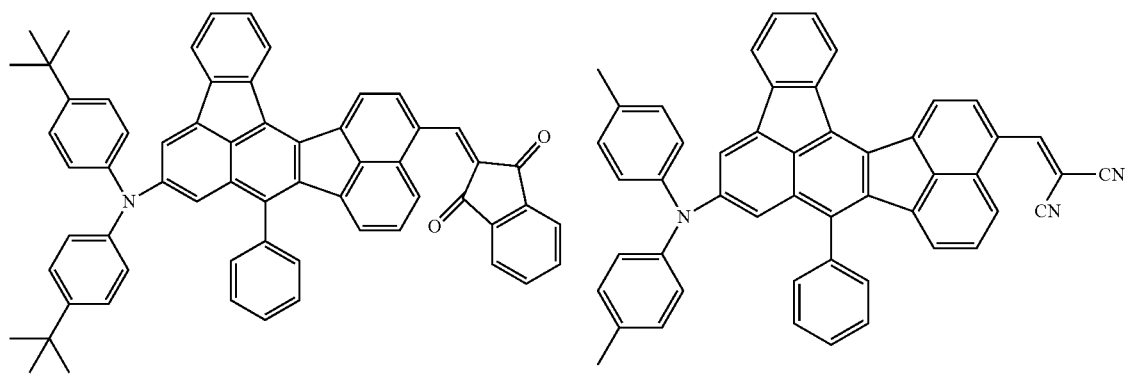
2-17
2-18
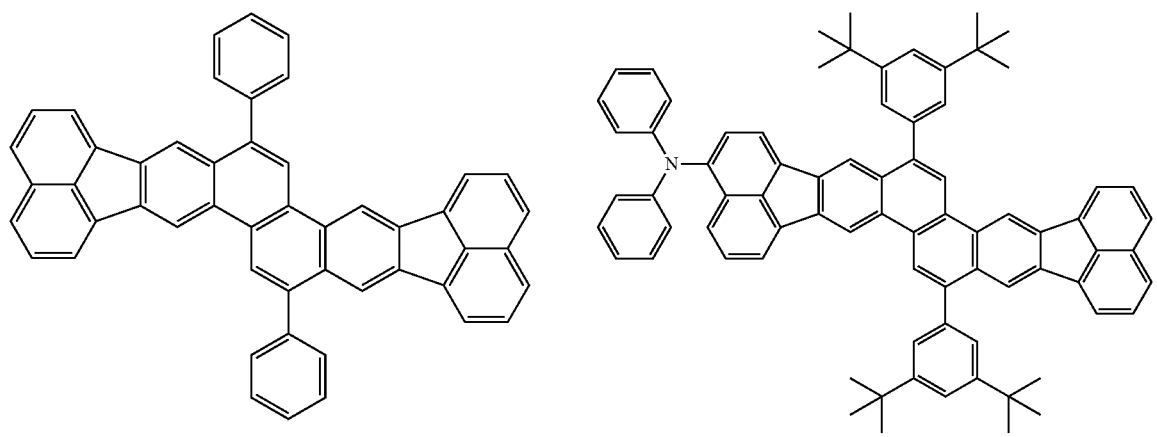
2-19
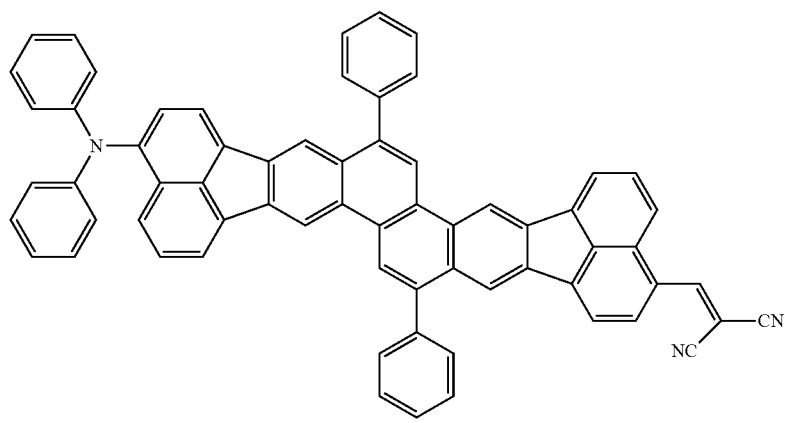

2-20
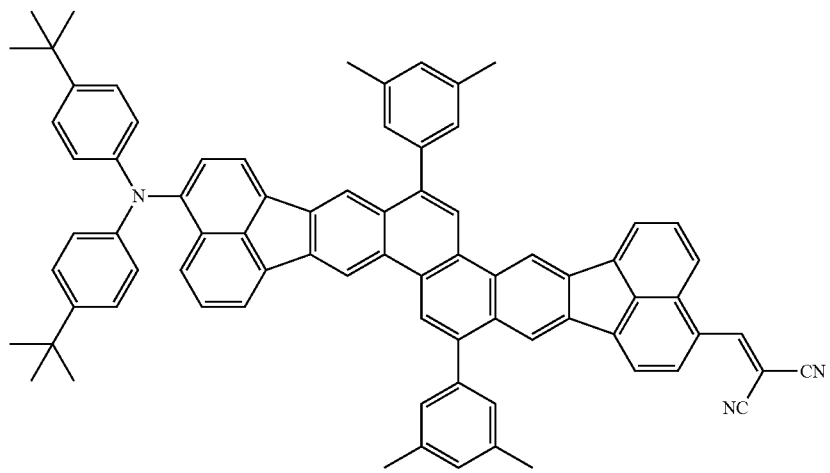
2-21
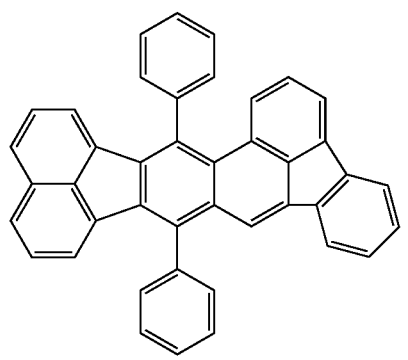
2-22
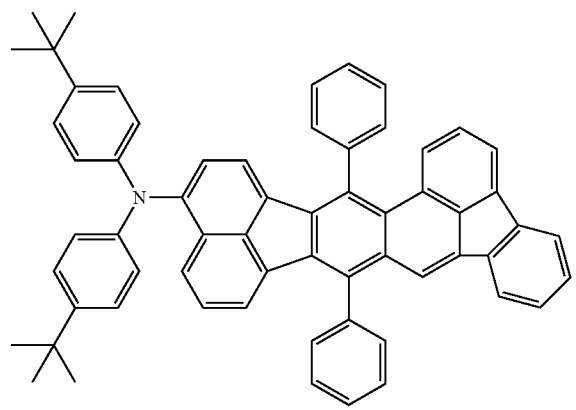
2-23
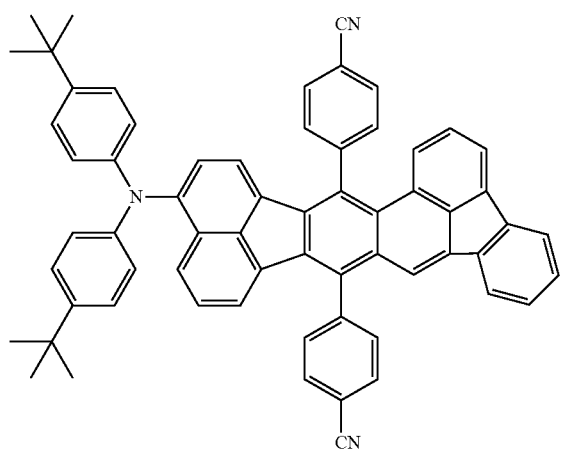
2-24
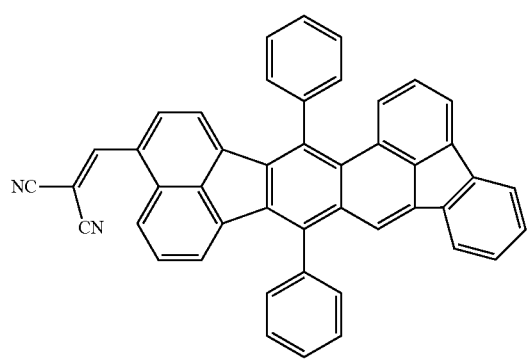

-continued
2-25
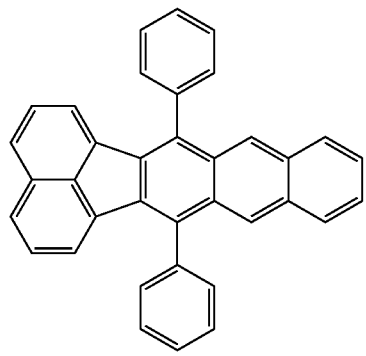
2-26
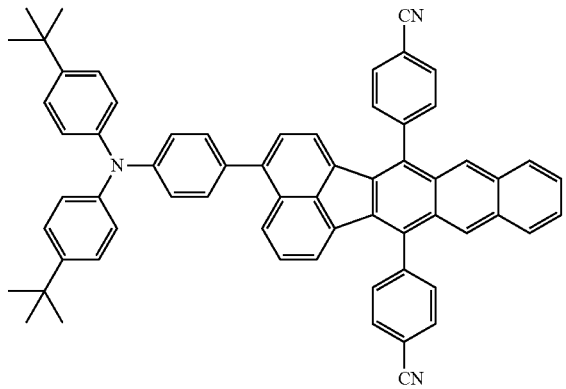
2-27
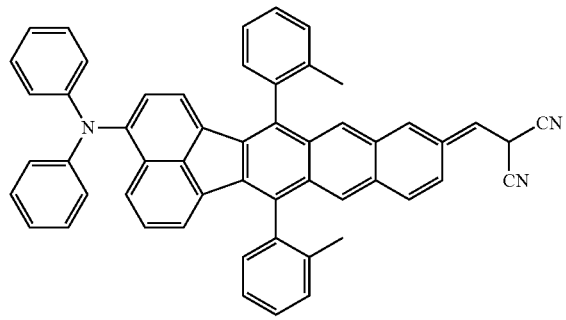
2-28
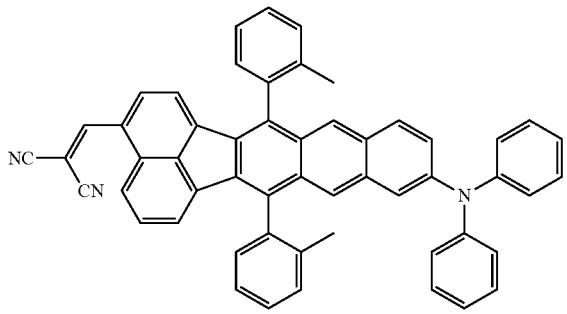
2-29
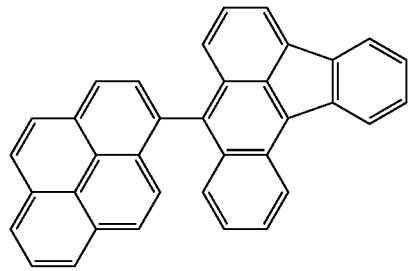
2-30
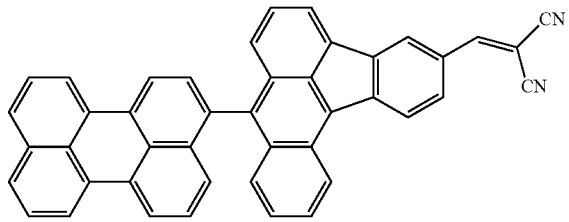
2-31
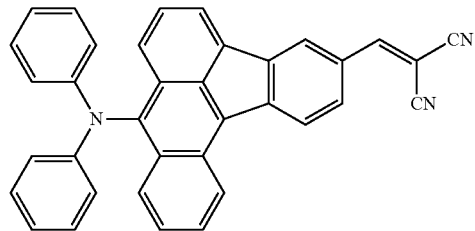
2-32
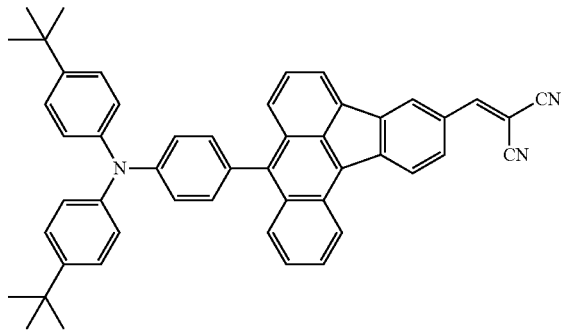

-continued
2-33
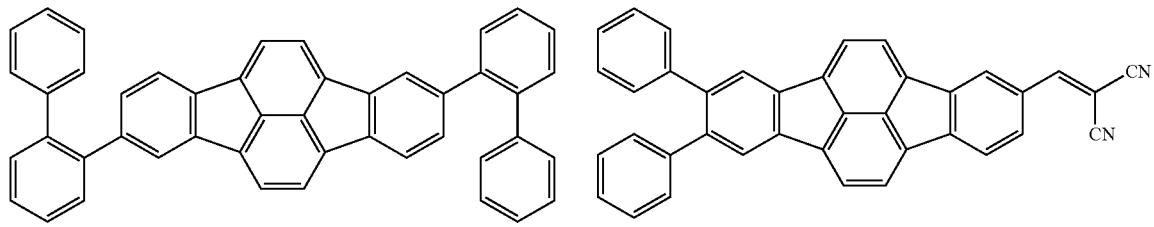
2-34
2-35
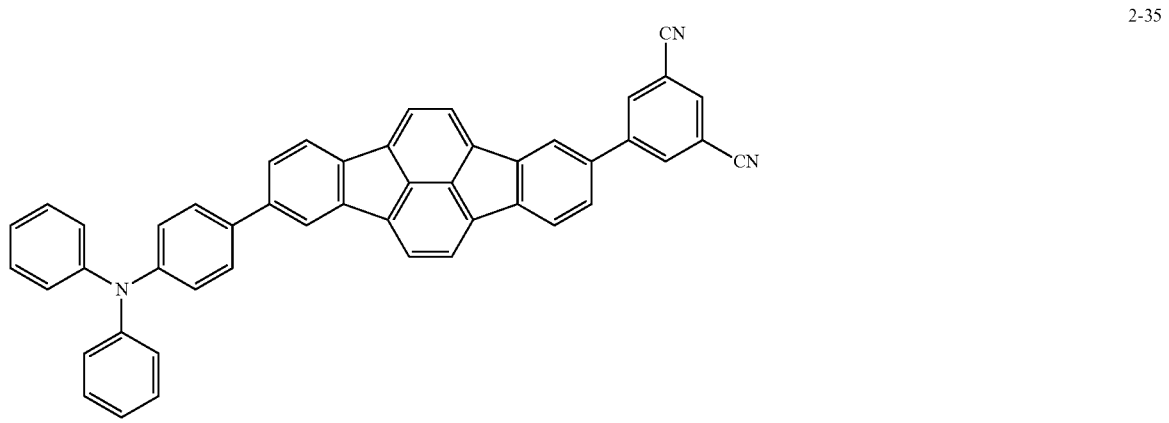
2-36 2-37
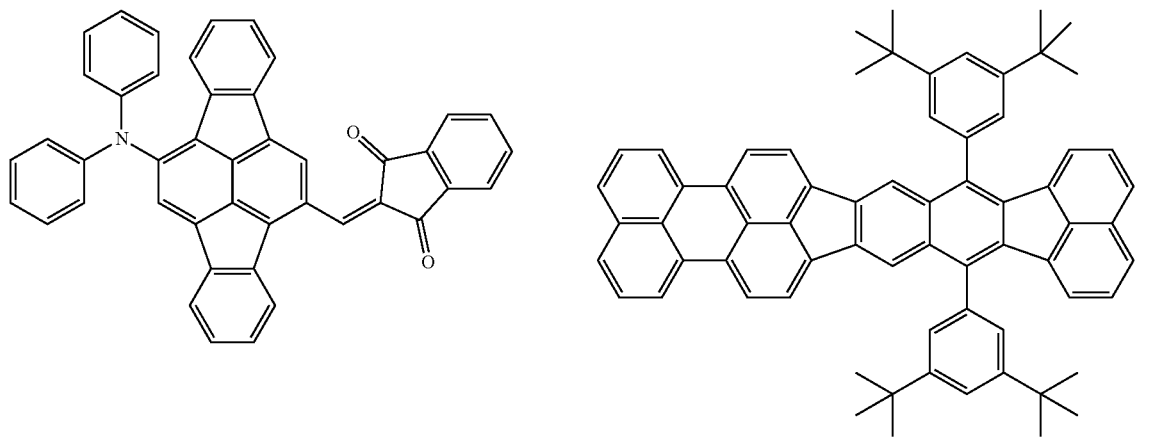
2-38 2-39
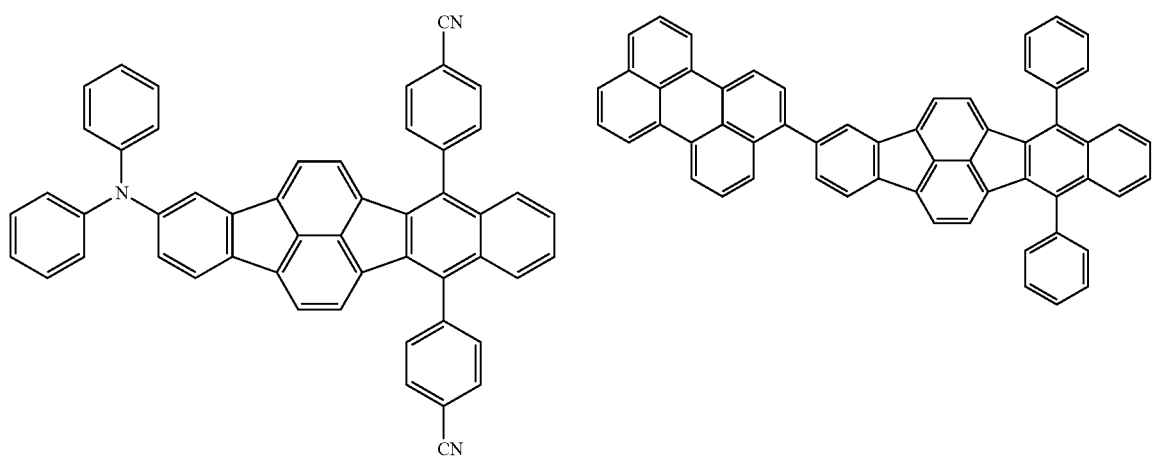

-continued
2-40
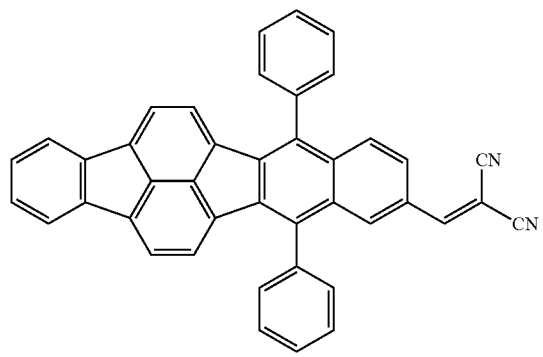
2-41
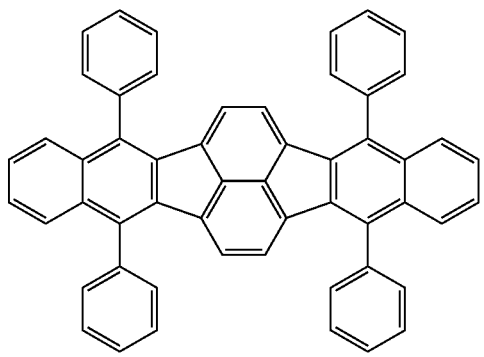
2-42
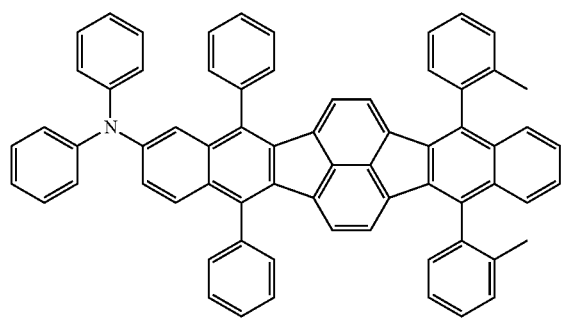
2-43
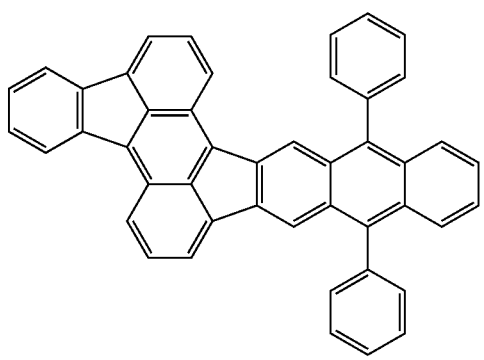
2-44
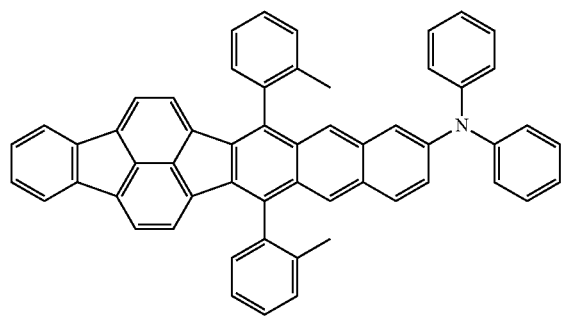
2-45
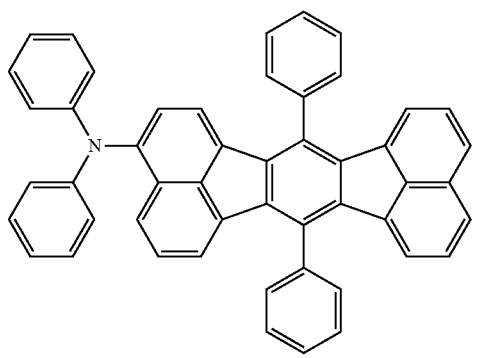
2-46
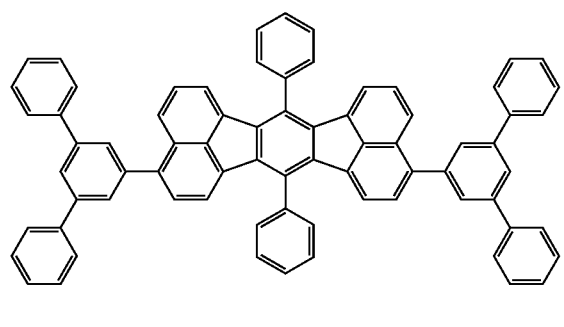
2-47
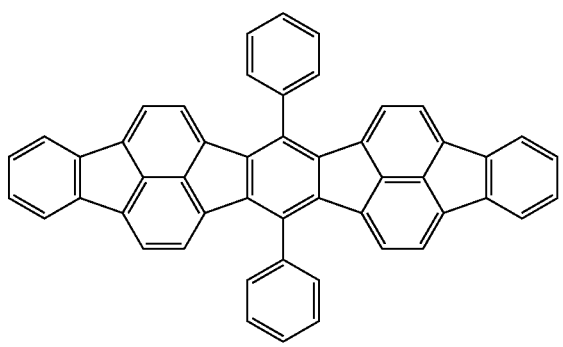

2-48
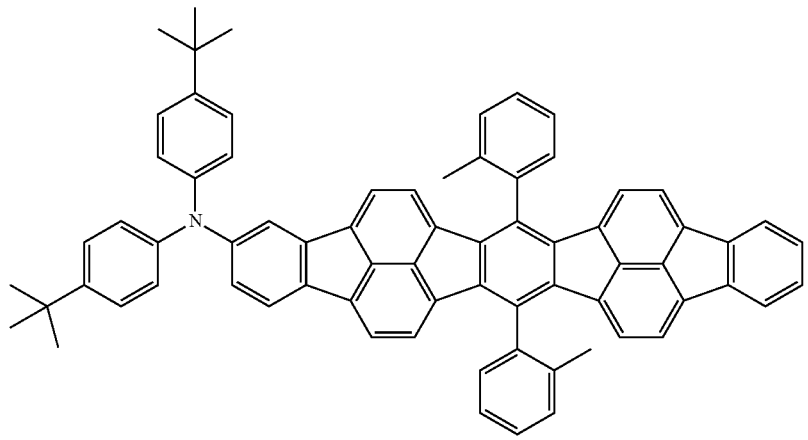
2-49 2-50
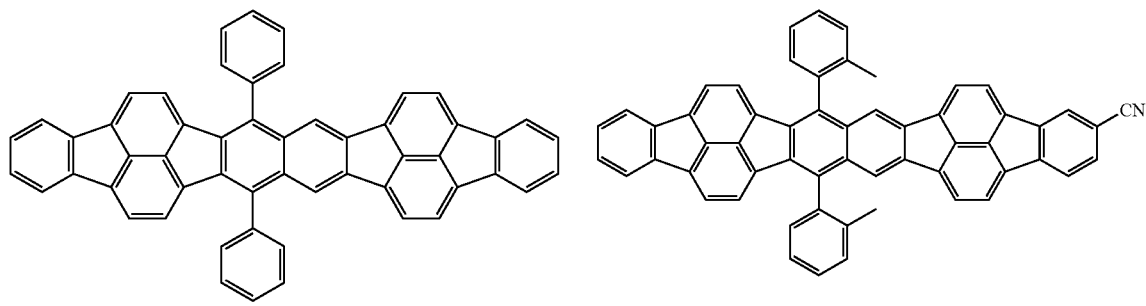
2-51 2-52
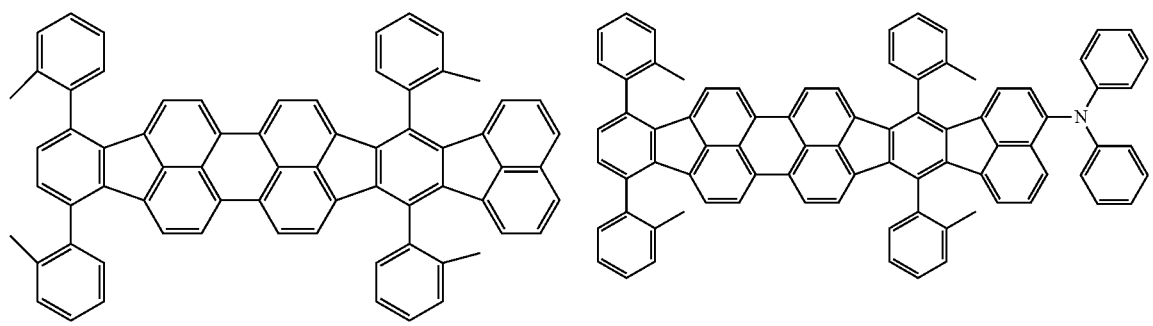
2-53
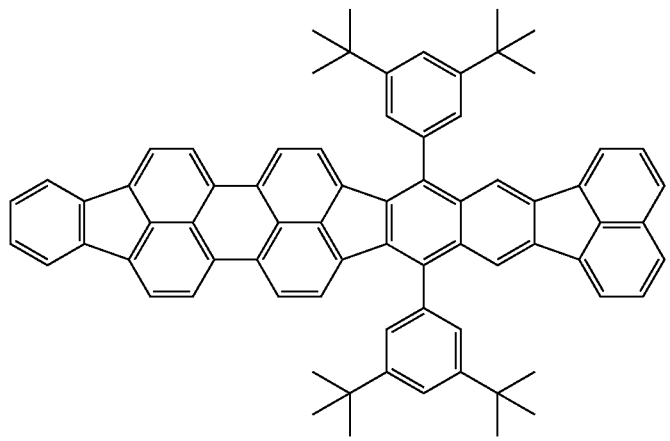

2-54
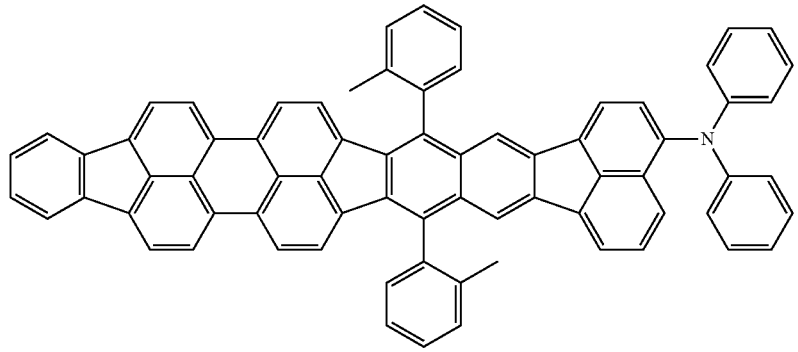
2-55
2-56
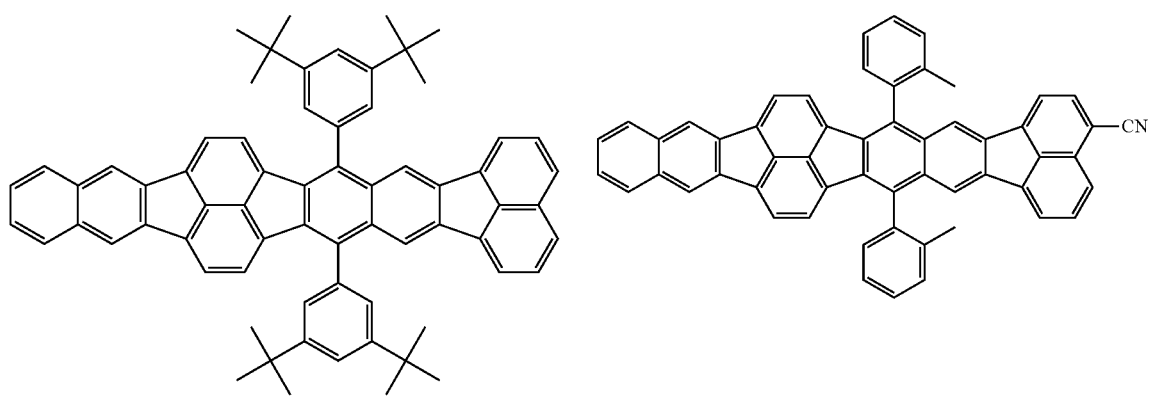
3-1
3-2
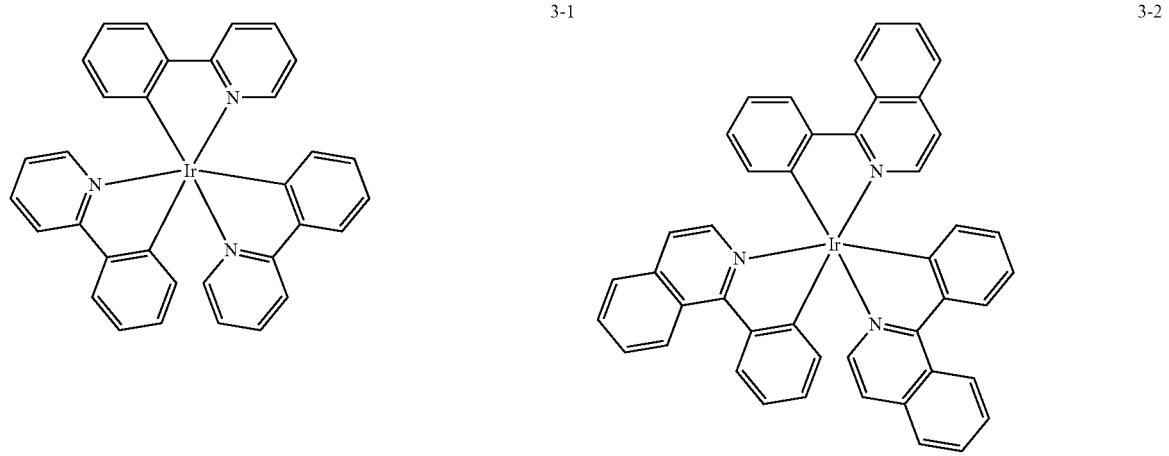
3-3
3-4
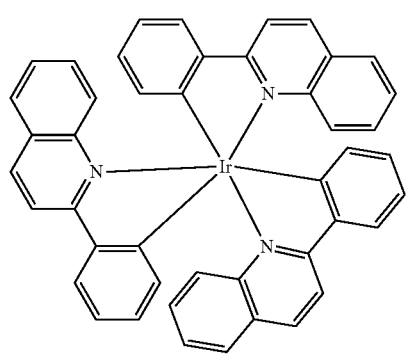
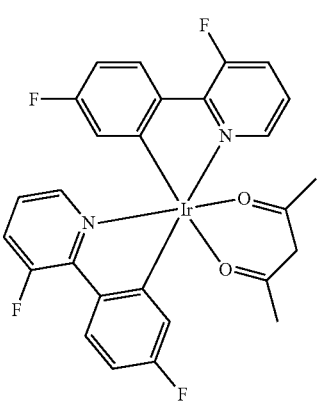

-continued
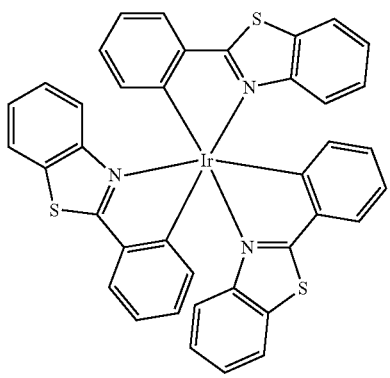
3-5
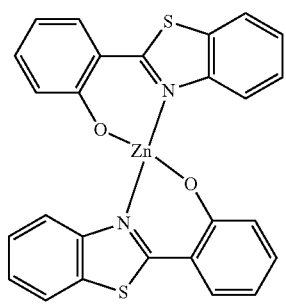
3-6
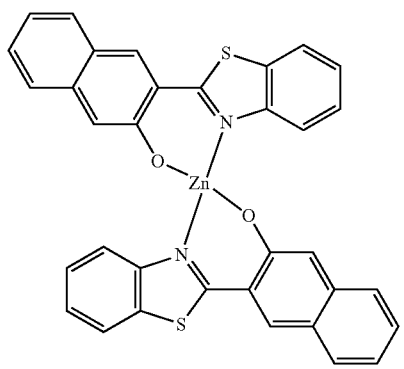
3-7
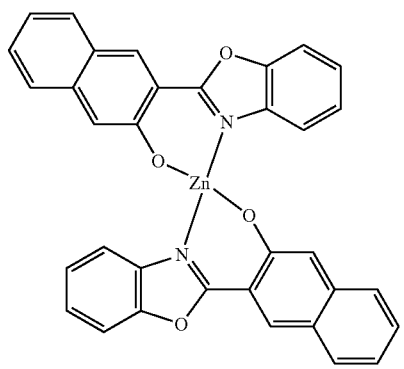
3-8
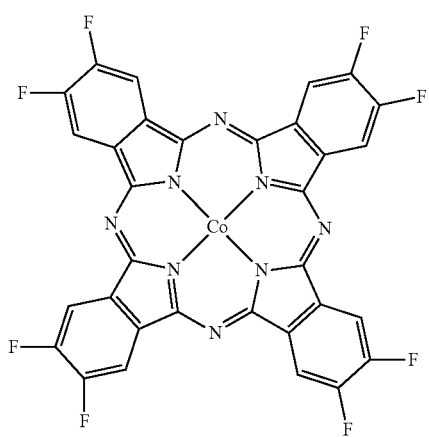
3-9
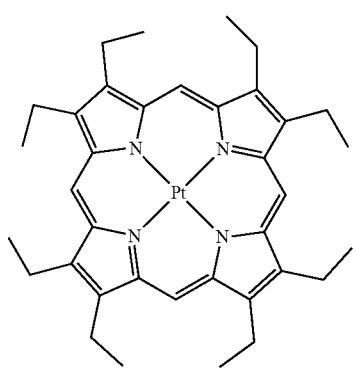
3-10
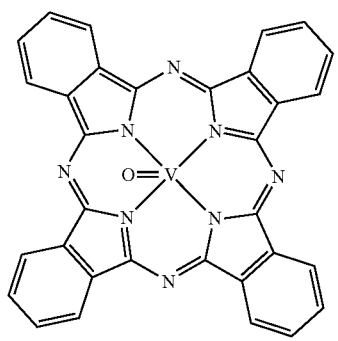
3-11
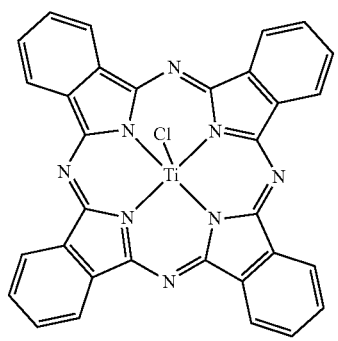
3-12

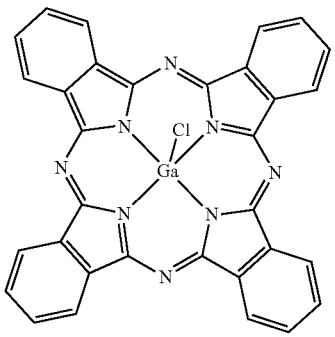

3-13

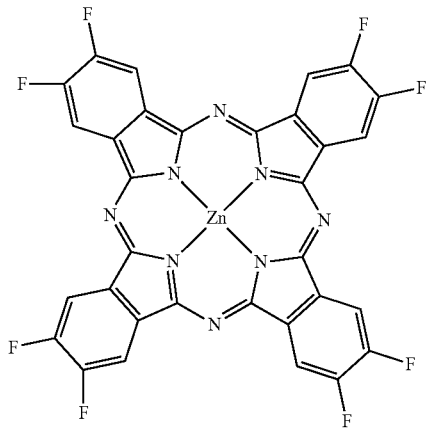

3-14

Exemplary examples 1-1 to 1-24 are a group of compounds having a sulfur-atom-containing five-membered heterocyclic group at the center. The compound which has the heterocyclic group and in which $Z_1$ is an electron-withdrawing substituent is a compound having a low HOMO level. As a result, $\Delta E$ can be increased, and generation of thermal electrons that cause dark current is suppressed.

Regarding exemplary examples 1-1 to 1-24, an organic compound having $Ar_1$ or $Ar_2$ has a large excluded volume and, therefore, has a low probability of contact with other molecules. Consequently, an acceptor material does not readily approach, and transfer of electrons due to thermal excitation does not readily occur. As a result, dark current can be reduced.

Exemplary examples 2-1 to 2-56 are a group of compounds having a fluoranthene skeleton at the center. The fluoranthene skeleton has an electron-withdrawing property and, therefore, is preferable first organic compound because generation of thermal electrons that cause dark current is suppressed.

Exemplary examples 3-1 to 3-14 are a group of complex compounds containing a metal atom at the center. Each ligand contains a heterocyclic compound as a section having an electron-withdrawing property and, thereby, generation of thermal electrons that cause dark current is suppressed. Consequently, these complex compounds are preferable as the first organic compound.

The first organic compound has an oxidation potential of preferably 0.65 V or more.

The photoelectric conversion layer may contain fullerene or a fullerene derivative as the second organic compound. The fullerene or fullerene derivative may function as an n-type organic semiconductor.

An electron transport path is formed by molecules of fullerene or a fullerene derivative being connected to each other in the photoelectric conversion layer. Consequently, an electron transport property is improved, and high-speed responsiveness of the photoelectric conversion element is improved.

The content of fullerene or a fullerene derivative may be 40% by weight or more and 85% by weight or less, where the total of the first organic compound and the second organic compound is assumed to be 100% by weight, in consideration of photoelectric conversion efficiency.

Examples of the fullerene or fullerene derivative include fullerene C60, fullerene C70, fullerene C76, fullerene C78, fullerene C80, fullerene C82, fullerene C84, fullerene C90, fullerene C96, fullerene C240, fullerene 540, mixed fullerene, and fullerene nanotube.

The fullerene derivative may have a substituent. Examples of the substituent include an alkyl group, an aryl group, and a heterocyclic group.

The fullerene derivative is preferably fullerene C60.

The photoelectric conversion layer is preferably non-radiative. Non-radiation is denoted as emission quantum efficiency of 1% or less, preferably 0.5% or less, and more preferably 0.1% or less in the visible light range (wavelength of 400 nm to 730 nm). When the emission quantum efficiency of the photoelectric conversion layer is 1% or less, even in the case of application to a sensor or an image pickup element, a preferable image pickup element is realized because an influence exerted on sensing performance or image pickup performance is at a low level.

The photoelectric conversion element according to the present invention may further include a hole-blocking layer 2 between the anode and the photoelectric conversion layer. The hole-blocking layer is a layer that suppresses flowing of holes from the anode into the photoelectric conversion layer, and it is preferable that the ionization potential be high.

The photoelectric conversion element according to the present invention may further include an electron-blocking layer 3 between the cathode and the photoelectric conversion layer. The electron-blocking layer is a layer that suppresses flowing of electrons from the cathode into the photoelectric conversion layer, and it is preferable that the electron affinity or LUMO (lowest unoccupied molecular orbital energy) be low.

Figure 2:
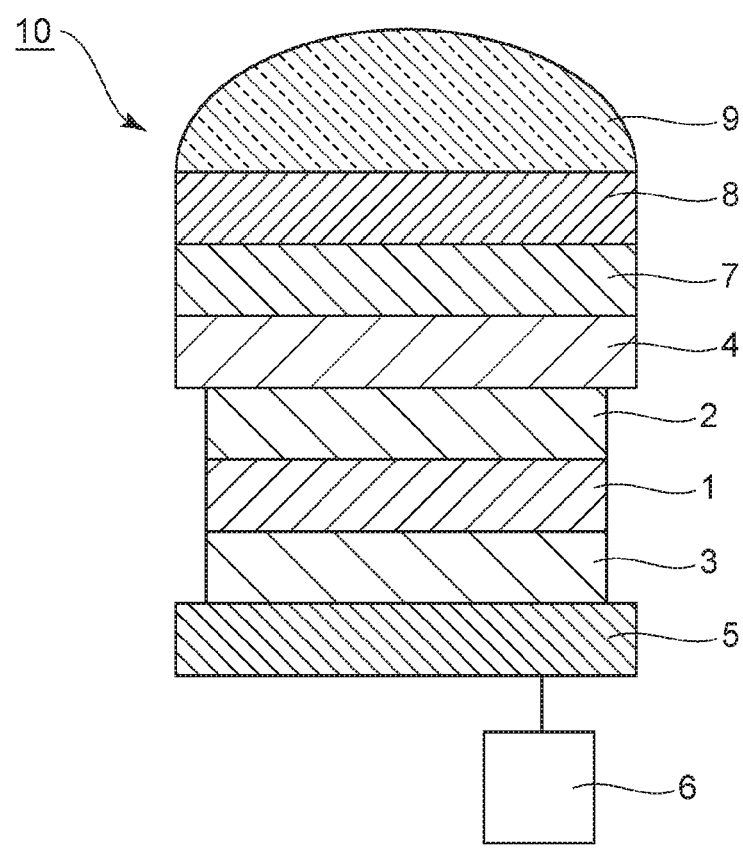
FIG. 2 is a schematic sectional view showing an example of a photoelectric conversion element according to the present invention.

FIG. 2 is a schematic sectional view showing an example of a photoelectric conversion element according to the present embodiment. In the photoelectric conversion element, a photoelectric conversion layer 1 that converts light to electric charge is disposed between an anode 4 and a cathode 5 that are a pair of electrodes. A protective layer 7, a wavelength selection portion 8, and a microlens 9 are disposed on the anode. A reading circuit 6 is connected to the cathode.

Regarding the pair of electrodes, an electrode nearer to a substrate may be called a lower electrode, and an electrode farther from the substrate may be called an upper electrode. The lower electrode may be the anode or the cathode. The lower electrode may be an electrode having a high reflectance. The electrode may be composed of a material having high reflectance, or a reflective layer may be included in addition to the electrode layer.

The photoelectric conversion element according to the present invention may include the substrate. Regarding the substrate, for example, a silicon substrate, a glass substrate, a flexible substrate, or the like may be used.

The cathode included in the photoelectric conversion element according to the present invention is an electrode that collects holes of the charge generated in the photoelectric conversion layer. On the other hand, the anode is an electrode that collects electrons of the charge generated in the photoelectric conversion layer. There is no limitation regarding the material for constituting the cathode and the anode as long as electrical conductivity is high and transparency is provided. The materials for constituting the cathode and the anode may be the same or different from each other.

Specific examples of the material for constituting the electrode include a metal, a metal oxide, a metal nitride, a metal boride, and an organic conductive compound and mixtures of these. Further specific examples include a conductive metal oxide, for example, tin oxide doped with antimony, fluorine, or the like (ATO, FTO), tin oxide, zinc oxide, indium oxide, indium tin oxide (ITO), or indium zinc oxide (IZO), a metal, for example, gold, silver, chromium, nickel, titanium, tungsten, or aluminum, a conductive compound, for example, an oxide, a nitride, or the like of these metals (titanium nitride (TiN) is an example), a mixture or a layered material of these metals and a conductive metal oxide, an inorganic conductive substance, for example, copper iodide or copper sulfide, an organic conductive material, for example, a polyaniline, a polythiophene, or a polypyrrole, and a layered material of these and ITO or titanium nitride. Examples of the particularly preferable material as the electrode include titanium nitride, molybdenum nitride, tantalum nitride, and tungsten nitride.

The hole or electron collection electrode included in the photoelectric conversion element according to the present invention is an electrode that collects holes or electrons of the charge generated in the photoelectric conversion layer. The collection electrode located at a lower portion may be a pixel electrode in the configuration of an image pickup element. Whether the pixel electrode is a cathode or an anode is determined in accordance with an element configuration or a circuit configuration of a groundwork. For example, the order may be substrate/anode/photoelectric conversion layer/cathode on the substrate, or the order may be substrate/cathode/photoelectric conversion layer/anode.

A method for forming the electrode may be appropriately selected in consideration of suitability for the electrode material. Specifically, formation may be performed by a wet system, for example, a printing system or a coating system, a physical system, for example, a vacuum evaporation method, a sputtering method, or an ion plating method, a chemical system, for example, CVD or a plasma CVD method, or the like.

In the case in which the electrode is ITO, formation may be performed by, for example, an electron beam method, a sputtering method, a resistance heating evaporation method, a chemical reaction method (sol-gel method or the like), or a method in which a dispersion of indium tin oxide is applied. Further, the resulting ITO may be subjected to UV-ozone processing, plasma processing, or the like. In the case in which the electrode is TiN, a reactive sputtering method or other various methods may be used, and annealing, UV-ozone processing, plasma processing, or the like may be further applied.

There is no particular limitation regarding a thin film sealing layer, and an inorganic material is used for formation. Specific examples include silicon oxide, silicon nitride, silicon oxynitride, and aluminum oxide. Silicon oxide, silicon nitride, and silicon oxynitride may be formed by a sputtering method or a CVD method. Aluminum oxide may be formed by an ALD method (atomic layer deposition method).

Regarding the sealing performance of the sealing layer, the water permeability has to be $10^{-5}$ g/m$^2$·day or less. There is no particular limitation regarding the layer thickness of the sealing layer, and 0.5 μm or more is preferable from the viewpoint of sealing performance. On the other hand, smaller thickness is favorable as long as the sealing performance is maintained, and 1 μm or less is particularly preferable.

The thin film sealing layer having a smaller thickness is preferable because an effect of reducing color mixing is enhanced as the distance from a photoelectric conversion layer to a color filter decreases in the case of use as an image pickup element.

In the case in which the photoelectric conversion element is produced, it is preferable that an annealing step be included. There is no particular limitation regarding the annealing temperature, and the condition of annealing temperature may be 150° C. or higher and 190° C. or lower. The annealing temperature is appropriately determined in accordance with an annealing time.

Image Pickup Element According to Embodiment

An image pickup element according to the present embodiment includes a plurality of pixels, and each of the pixels includes a photoelectric conversion element according to the present invention and a reading transistor connected to the photoelectric conversion element.

The plurality of pixels are arranged in the matrix with a plurality of rows and a plurality of columns. Each pixel may be connected to a signal processing circuit. The signal processing circuit can obtain an image by receiving a signal from each pixel.

The reading transistor is a transistor that transfers a signal based on charge generated in the photoelectric conversion element.

The signal processing circuit may be a CMOS sensor or a CCD sensor.

The image pickup element may include an optical filter, for example, a color filter. In the case in which the photoelectric conversion element addresses light with a specific wavelength, it is preferable that a color filter in accordance with the photoelectric conversion element be included. Regarding the color filter, one color filter may be disposed for one light-receiving pixel, or one color filter may be disposed for a plurality of light-receiving pixels.

Examples of the optical filter include, in addition to the color filter, a low-pass filter that transmits wavelengths of infrared rays or higher and a UV cut filter that transmits wavelengths of ultraviolet rays or lower.

The image pickup element may include an optical member, for example, a microlens. The microlens is a lens that condenses light from outside on a photoelectric conversion portion. Regarding the microlens, each light-receiving pixel may include one microlens, or one microlens may be disposed so as to address a plurality of light-receiving pixels. In the case in which a plurality of light-receiving pixels are disposed, it is preferable that each of the plurality of light-receiving pixels include one microlens.

The image pickup element according to the present invention may be used for an image pickup apparatus. The image pickup apparatus includes an image pickup optical system including a plurality of lenses and an image pickup element that receives light passing through the image pickup optical system. In addition, the image pickup apparatus includes the image pickup element and a casing that accommodates the image pickup element. The casing may includes a connection portion that can be connected to the image pickup optical system. More specifically, the image pickup apparatus is a digital camera or a digital steel camera.

Further, the image pickup apparatus may include a receiving portion that receives a signal from outside. The signal received by the receiving portion is a signal that can control at least one of an image pickup range, start of image pickup, and finish of image pickup of the image pickup apparatus. In addition, the image pickup apparatus may further includes a sending portion that sends an acquired image to outside. Examples of the acquired image include a picked-up image and an image sent from another device.

When the receiving portion and the sending portion are included, the image pickup element can be used as a network camera.

Figure 3:
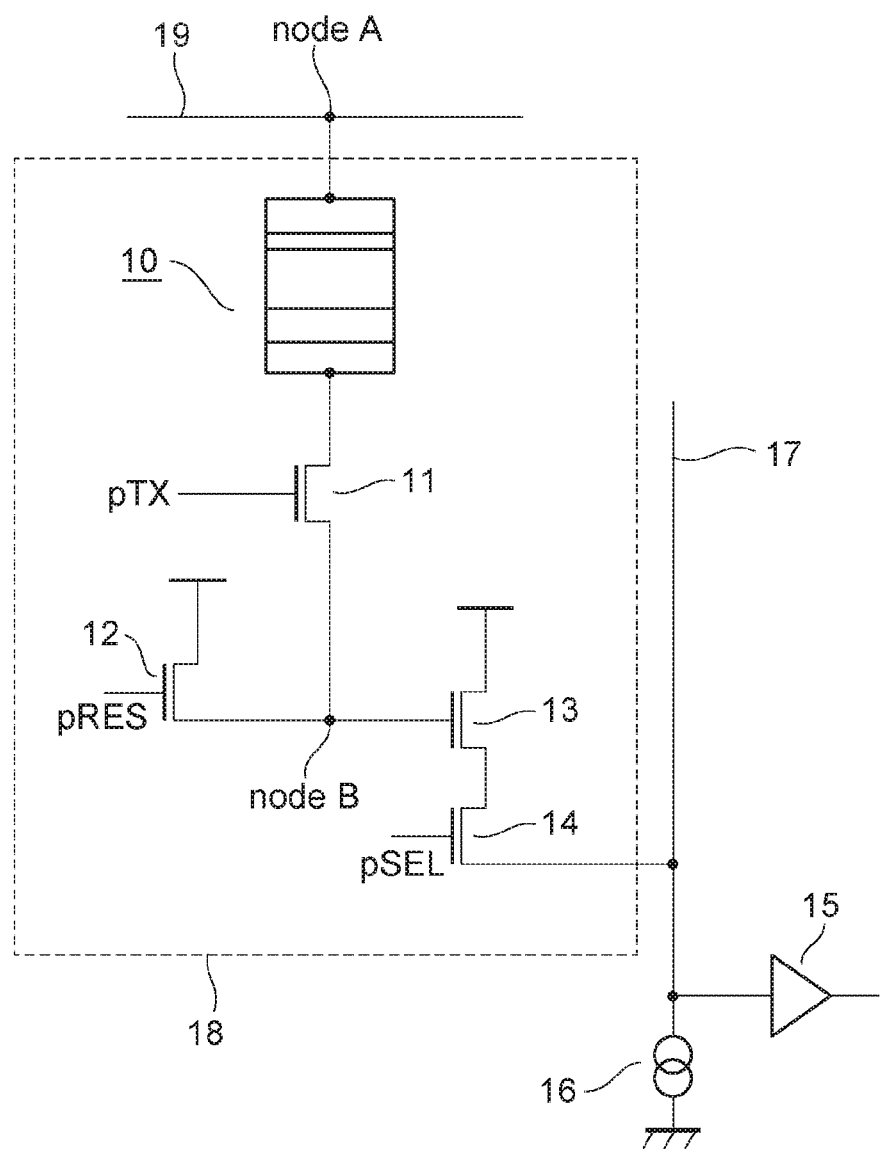
FIG. 3 is a diagram showing an example of a circuit that drives a pixel including a photoelectric conversion element according to the present invention.

FIG. 3 is a circuit diagram of a pixel including a photoelectric conversion element according to the present invention. The photoelectric conversion element 10 is connected to a common conductive line 19 at node A. The common conductive line may be connected to the ground.

A pixel 18 may include the photoelectric conversion element 10 and a reading circuit that reads a signal generated in the photoelectric conversion portion. The reading circuit may include, for example, a transfer transistor 11 electrically connected to the photoelectric conversion element, an amplifying transistor 13 including a gate electrode electrically connected to the photoelectric conversion element 10, a selection transistor 14 that selects a pixel from which information is read, and a reset transistor 12 that supplies a reset voltage to the photoelectric conversion element.

Transfer of the transfer transistor 11 may be controlled by pTX. Supply of the voltage to the reset transistor may be controlled by pRES. The selection transistor is set to be in the state of selection or non-selection by pSEL.

The transfer transistor 11, the reset transistor 12, and the amplifying transistor 13 are connected to each other at node B. It is possible to include no transfer transistor in accordance with the configuration.

The reset transistor is a transistor that supplies a voltage to reset the potential at node B. Supply of the voltage can be controlled by applying pRES to the gate of the reset transistor. It is possible to include no reset transistor in accordance with the configuration.

The amplifying transistor is a transistor that passes a current in accordance with the potential at node B. The amplifying transistor is connected to the selection transistor 14 that selects a pixel from which a signal is output. The selection transistor is connected to a current source 16 and a column output portion 15, and the column output portion 15 may be connected to a signal processing portion.

The selection transistor 14 is connected to a vertical output signal line 17. The vertical output signal line 17 is connected to the current source 16 and the column output portion 15.

Figure 4:
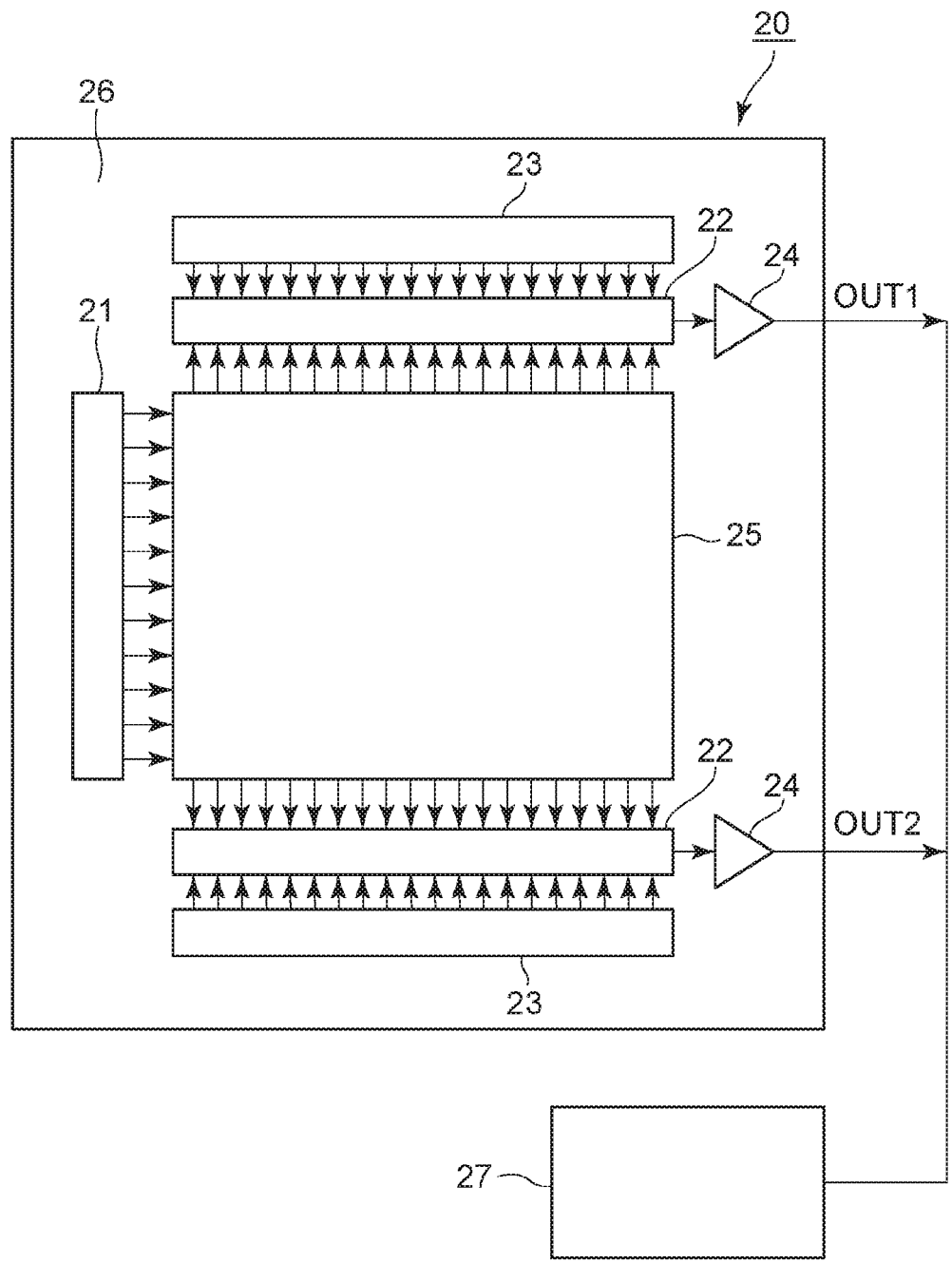
FIG. 4 is a schematic diagram showing an example of a peripheral circuit of an image pickup element including a photoelectric conversion element according to the present invention.

FIG. 4 is a diagram showing an image pickup element according to the present invention. The image pickup element 20 includes an image pickup region 25 in which a plurality of pixels are two-dimensionally arranged and a peripheral region 26. A region other than the image pickup region is the peripheral region. The peripheral region includes a vertical scanning circuit 21, a reading circuit 22, a horizontal scanning circuit 23, and an output amplifier 24, and the output amplifier is connected to a signal processing portion 27. The signal processing portion is a signal processing portion that performs signal processing based on the information read by the reading circuit, and examples include a CCD circuit and a CMOS circuit.

The reading circuit 22 includes, for example, a column amplifier, a CDS circuit, an adding circuit, and the like and performs amplification, addition, and the like relative to signals read through the vertical signal line from pixels in the row selected by the vertical scanning circuit 21. The column amplifier, the CDS circuit, the adding circuit, and the like are arranged, for example, on a pixel column or a plurality of pixel columns basis. The horizontal scanning circuit 23 generates signals for sequentially reading signals of the reading circuit 22. The output amplifier 24 amplifies and outputs signals of a row selected by the horizontal scanning circuit 23.

The above-described configuration is just a configuration example of the photoelectric conversion apparatus, and the present embodiment is not limited to this. In order to configure two series of output paths, one each of the reading circuit 22, the horizontal scanning circuit 23, and the output amplifier 24 is arranged on and under the image pickup region 25. However, three or more output paths may be disposed. Signals output from output amplifiers are combined as an image signal in the signal processing portion.

EXAMPLES

Measurement of Oxidation Potential of First Organic Compound

Electrochemical characteristics, for example, an oxidation potential, can be evaluated by cyclic voltammetry (CV).

Figure 5:
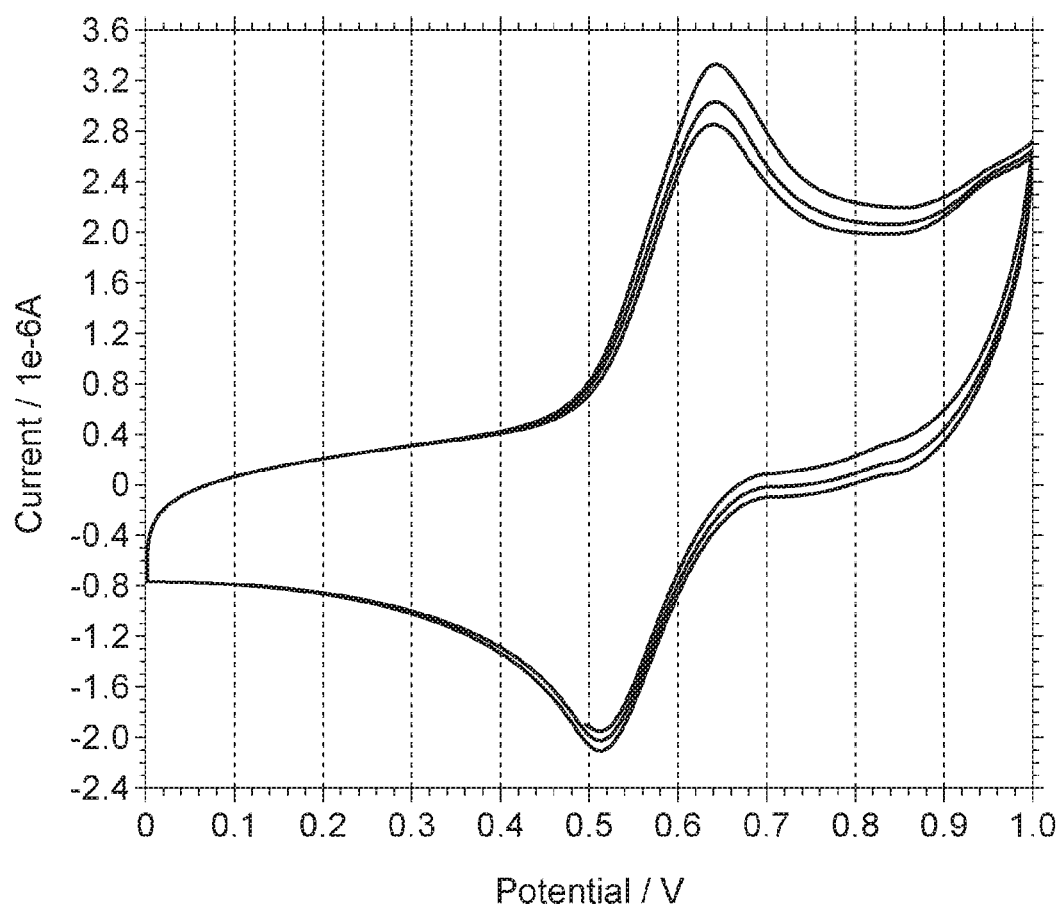
FIG. 5 is a diagram showing an example of a cyclic voltammogram that determines the oxidation potential and the reduction potential of an organic compound.

A CV measurement sample was prepared by dissolving about 1 mg of first organic compound into 10 mL of 0.1-M ortho-dichlorobenzene solution of tetrabutylammonium perchlorate and performing deaeration treatment using nitrogen. A three-electrode method was used for the CV measurement. Regarding the electrodes, a nonaqueous-solvent-based $Ag/Ag^+$ reference electrode, a platinum counter electrode having a diameter of 0.5 mm and a length of 5 cm, and a glassy carbon working electrode having an inner diameter of 3 mm (every electrode was produced by BAS Inc.) were used. An electrochemical analyzer Model 660C produced by ALS Co., Ltd., was used as an electrochemical measurement apparatus. The sweep rate of the measurement was set to be 0.1 V/s. FIG. 5 is a diagram showing an example of a cyclic voltammogram that determines the oxidation potential and the reduction potential of an organic compound. The oxidation potential and the reduction potential can be assumed from a peak value of the cyclic voltammogram. In the present specification, the oxidation potential is referred to as Eox and the reduction potential is referred to as Ered.

Table 1 shows the oxidation potentials of exemplary compounds of the first organic compound.

TABLE 1

| First organic compound | Eox [V] |
|---|---|
| 1-1 | 0.58 |
| 1-3 | 0.59 |

TABLE 1-continued

| First organic compound | Eox [V] |
|---|---|
| 1-5 | 0.63 |
| 1-6 | 0.67 |
| 1-7 | 0.67 |
| 1-8 | 0.67 |
| 1-9 | 1.12 |
| 1-13 | 0.69 |
| 1-16 | 0.73 |
| 1-21 | 0.75 |
| 1-22 | 0.84 |
| 1-24 | 1.03 |
| 2-1 | 0.70 |
| 2-2 | 0.71 |
| 2-14 | 1.09 |
| 3-1 | 0.54 |
| 3-2 | 0.67 |
| 3-4 | 0.90 |
| 2-37 | 0.66 |
| 2-43 | 0.84 |

Example 1

In the present example, a photoelectric conversion element was produced by using a combination of a first organic compound and a second organic compound, where ΔE≥1.5 V applied. Dark current was measured by using the resulting photoelectric conversion element.

In the present example, the photoelectric conversion element was formed on a Si substrate. In the photoelectric conversion element, a cathode, an electron-blocking layer, a photoelectric conversion layer, a hole-blocking layer, and an anode were sequentially formed.

In the present example, the photoelectric conversion element was produced in the following steps.

Initially, the Si substrate was prepared, in which a wiring layer and an insulating layer were stacked and, for the purpose of enabling communication, contact holes were disposed from the wiring layer through the insulating layer at a place corresponding to each pixel by forming an opening. This contact hole is connected to a pad portion at a substrate edge by a conductive line. An IZO electrode was formed by a sputtering method so as to overlap the contact hole portion. Patterning was performed so as to form 3 mm² of IZO electrode (cathode). At this time, the film thickness of the IZO electrode was set to be 100 nm.

An organic compound layer was formed on the IZO electrode by a vacuum evaporation method. The layer configuration and the layer thickness were as shown in Table 2 below. Subsequently, IZO serving as an anode was formed by a sputtering method. The thickness of the anode was set to be 30 nm.

The layer configuration of the photoelectric conversion element is shown in Table 2.

TABLE 2

| | Constituent material | Layer thickness |
|---|---|---|
| Anode | IZO | 30 nm |
| Hole-blocking layer | d-2(C60) | 20 nm |
| Photoelectric conversion layer | exemplary compounds 1-6:d-2(C60) = 25:75 | 380 nm |
| Electron-blocking layer | d-1 | 80 nm |
| Cathode | IZO | 100 nm |

In this regard, in Table 2, the cathode serving as a lower electrode is described in the lower side of the table.

Regarding the electron-blocking layer, compound (d-1) below was used.

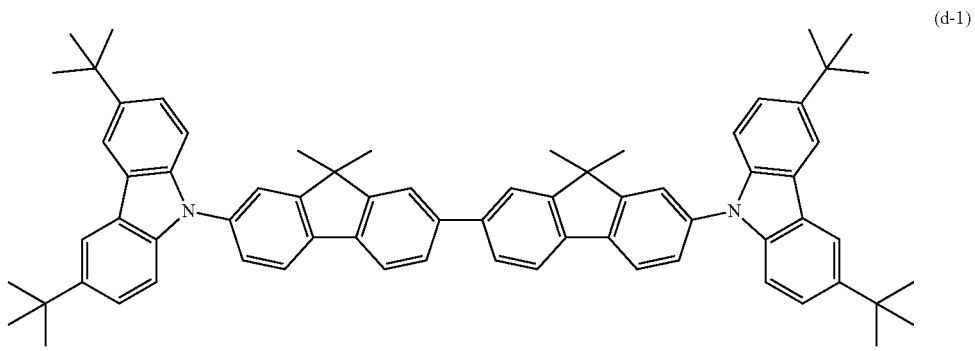 [SMILES: CC(C)(C)c1ccc2c(c1)c1cc(C(C)(C)C)ccc1n2-c1ccc2c(c1)C(C)(C)c1cc(-c3ccc4c(c3)C(C)(C)c3cc(-n5c6ccc(C(C)(C)C)cc6c6cc(C(C)(C)C)ccc65)ccc3-4)ccc1-2]

(d-1)

Regarding the first organic compound of the photoelectric conversion layer, any one of exemplary compounds 1-1 to 3-14 was used. Regarding the hole-blocking layer, any one of fullerene C60 (d-2), fullerene C70 (d-3), and organic compound (d-4) below was used.

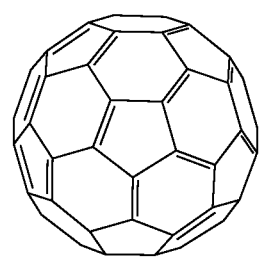

(d-2)

-continued

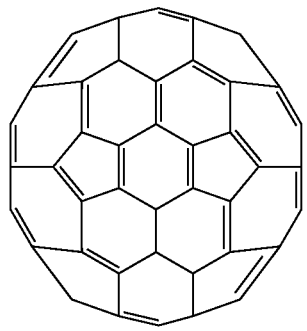
(d-3)

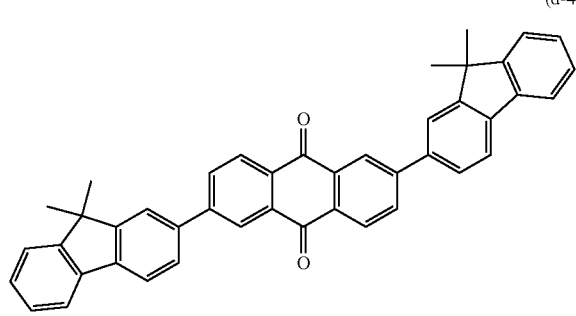
(d-4)

In this regard, the reduction potentials of d-2, d-3, and d-4 are as shown in Table 3.

TABLE 3

| Second organic compound | Ered (V) |
|---|---|
| d-2 | −0.83 |
| d-3 | −0.79 |
| d-4 | −1.04 |

After the upper electrode was formed, hollow sealing was performed by using a glass cap and an ultraviolet-effect resin. The thus obtained element with a sealed surface upward was annealed on a hot plate at 170° C. for about 1 hour.

Regarding the resulting element, the characteristics of the photoelectric conversion element were measured and evaluated. A current when 5 V was applied to the element was examined. Regarding every element, the current value at a bright place was at least 10 times the current value at a dark place and, therefore, it was ascertained that the photoelectric conversion element functioned.

In the measurement of dark current, the photoelectric conversion element was held in a constant temperature bath at 60° C. and the measurement was performed by bringing a prober wired to a semiconductor parameter analyzer (4155C, Agilent Technologies, Inc.) into contact with an electrode.

The evaluation criteria of the dark current was as described below.
A: less than 100 pA/cm$^2$
B: 100 pA/cm$^2$ or more and less than 1,000 pA/cm$^2$
C: 1,000 pA/cm$^2$ or more and less than 2,000 pA/cm$^2$
D: 2 nA/cm$^2$ or more and less than 10 nA/cm$^2$
E: 10 nA/cm$^2$ or more
A to C were rated as good, and D and E were rated as poor.
The dark current evaluation of the photoelectric conversion element of example 1 was C. For example, in the case of a pixel of 10 μm square, the area is $1.0 \times 10^{-6}$ cm$^2$. When this photoelectric conversion element is used for an image pickup element, an image pickup element with low dark current can be obtained. The low-dark-current characteristics is associated with noise reduction of the image pickup element.

Examples 2 to 47

Photoelectric conversion elements were produced in the same manner as example 1 except that the combination of the first organic compound and the second organic compound was changed to a combination shown in Table 4. The results of examples 1 to 47 are shown in Table 4 below.

TABLE 4

| Example | First organic compound | Second organic compound | ΔE | Rating |
|---|---|---|---|---|
| 1 | 1-6 | d-2 | 1.50 | C |
| 2 | 1-7 | d-2 | 1.50 | C |
| 3 | 1-8 | d-2 | 1.50 | C |
| 4 | 3-2 | d-2 | 1.50 | C |
| 5 | 2-2 | d-3 | 1.50 | C |
| 6 | 1-13 | d-2 | 1.52 | C |
| 7 | 1-16 | d-3 | 1.52 | C |
| 8 | 2-1 | d-2 | 1.53 | C |
| 9 | 2-2 | d-2 | 1.54 | C |
| 10 | 1-21 | d-3 | 1.54 | C |
| 11 | 1-16 | d-2 | 1.56 | C |
| 12 | 1-21 | d-2 | 1.58 | C |
| 13 | 3-1 | d-4 | 1.58 | C |
| 14 | 1-1 | d-4 | 1.62 | C |
| 15 | 1-22 | d-3 | 1.63 | C |
| 16 | 2-43 | d-3 | 1.63 | C |
| 17 | 1-3 | d-4 | 1.63 | B |
| 18 | 1-22 | d-2 | 1.67 | C |
| 19 | 2-43 | d-2 | 1.67 | B |
| 20 | 1-5 | d-4 | 1.67 | C |
| 21 | 3-4 | d-3 | 1.69 | C |
| 22 | 2-37 | d-4 | 1.70 | B |
| 23 | 1-6 | d-4 | 1.71 | C |
| 24 | 1-7 | d-4 | 1.71 | C |
| 25 | 1-8 | d-4 | 1.71 | C |
| 26 | 3-2 | d-4 | 1.71 | B |
| 27 | 3-4 | d-2 | 1.73 | B |
| 28 | 1-13 | d-4 | 1.73 | B |
| 29 | 2-1 | d-4 | 1.74 | B |
| 30 | 2-2 | d-4 | 1.75 | B |
| 31 | 1-23 | d-3 | 1.75 | B |
| 32 | 1-16 | d-4 | 1.77 | B |
| 33 | 1-21 | d-4 | 1.79 | A |
| 34 | 1-23 | d-2 | 1.79 | A |
| 35 | 1-24 | d-3 | 1.82 | A |
| 36 | 1-24 | d-2 | 1.86 | A |
| 37 | 1-22 | d-4 | 1.88 | A |
| 38 | 2-43 | d-4 | 1.88 | A |
| 39 | 2-14 | d-3 | 1.88 | A |
| 40 | 1-9 | d-3 | 1.91 | A |
| 41 | 2-14 | d-2 | 1.92 | A |
| 42 | 3-4 | d-4 | 1.94 | A |
| 43 | 1-9 | d-2 | 1.95 | A |
| 44 | 1-23 | d-4 | 2.00 | A |
| 45 | 1-24 | d-4 | 2.07 | A |
| 46 | 2-14 | d-4 | 2.13 | A |
| 47 | 1-9 | d-4 | 2.16 | A |

Comparative Examples 1 to 16

Photoelectric conversion elements were produced in the same manner as example 1 except that the combination of the first organic compound and the second organic compound was changed to a combination shown in Table 5. The combination of compounds shown in Table 5 was a combination where ΔE<1.5 V applied. The resulting photoelectric conversion element was subjected to the dark current evaluation in the same measuring method as example 1.

TABLE 5

| Comparative example | First organic compound | Second organic compound | ΔE | Rating |
|---|---|---|---|---|
| 1 | 3-1 | d-3 | 1.33 | E |
| 2 | 3-1 | d-2 | 1.37 | E |
| 3 | 1-1 | d-3 | 1.37 | E |
| 4 | 1-3 | d-3 | 1.38 | E |
| 5 | 1-1 | d-2 | 1.41 | E |
| 6 | 1-3 | d-2 | 1.42 | E |
| 7 | 1-5 | d-3 | 1.42 | E |
| 8 | 2-37 | d-3 | 1.45 | D |
| 9 | 1-5 | d-2 | 1.46 | D |
| 10 | 1-6 | d-3 | 1.46 | D |
| 11 | 1-7 | d-3 | 1.46 | D |
| 12 | 1-8 | d-3 | 1.46 | D |
| 13 | 3-2 | d-3 | 1.46 | D |
| 14 | 1-13 | d-3 | 1.48 | D |
| 15 | 2-37 | d-2 | 1.49 | D |
| 16 | 2-1 | d-3 | 1.49 | D |

Regarding the photoelectric conversion elements that exhibited ΔE of 1.5 V or more, the results of the dark current evaluation of the elements of all combinations were C or better and, therefore, low-dark-current characteristics were obtained.

Example 48

Regarding exemplary compound 1-7 used in example 2, changes in the dark current when mixing concentration was changed from 20% by weight to 30% by weight in steps of 2.5% by weight are shown in Table 6.

TABLE 6

| Exemplary compound | Mixing concentration (% by weight) | Dark current (normalized by value at 20% by weight) |
|---|---|---|
| 1-7 | 35 | 11.6 |
|  | 27.5 | 4.2 |
|  | 25 | 2.8 |
|  | 22.5 | 1.1 |
|  | 20 | 1 |

According to Table 6, the concentration of the first organic compound is preferably less than 35% by weight and more preferably 27.5% by weight or less. The lower limit concentration is not limited by the present invention and may be, for example, a concentration at which necessary absorptance is obtained.

Examples 49 to 52 and Comparative Example 17

Photoelectric conversion elements were produced in the same manner as example 1 except that the constituent material and the layer thickness were set to be as shown in Table 7. Regarding the first organic compound, the exemplary compound shown in Table 8 or comparative compound (e-1) below was used but is expressed as "first organic compound" in Table 7. The dark current of each element was measured and relative evaluation was performed. The structure of comparative compound (e-1) was as described below. The oxidation potential of compound e-1 was 0.92 V.

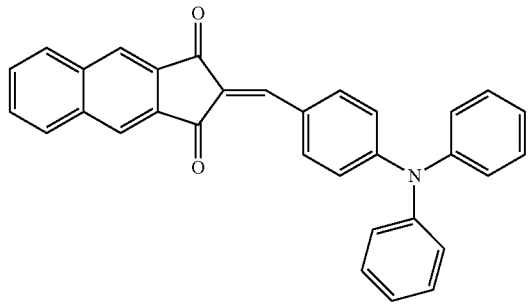

(e-1)

TABLE 7

| | Constituent material | Layer thickness |
|---|---|---|
| Anode | IZO | 30 nm |
| Hole-blocking layer | d-2(C60) | 10 nm |
| Photoelectric conversion layer | first organic compound: d-2(C60) = 25:75 | 200 nm |
| Electron-blocking layer | d-1 | 50 nm |
| Cathode | IZO | 100 nm |

TABLE 8

| | First organic compound | ΔE [V] | Relative value of dark current of photoelectric conversion element |
|---|---|---|---|
| Example 50 | 1-9 | 1.95 | 0.5 |
| Example 51 | 1-24 | 1.86 | 0.6 |
| Example 52 | 2-14 | 1.92 | 0.4 |
| Comparative example 17 | e-1 | 1.75 | 1 |

Dark current can be reduced not only by satisfying ΔE≥1.5 V but also by using the organic compound denoted by general formula [1] as the first organic compound.

Example 53 and Comparative Example 18

Regarding the first organic compound having a partial structure denoted by general formula [28], the maximum absorption peak wavelength and the molar absorptivity of the exemplary compounds below are described. The maximum absorption peak wavelength refers to the wavelength of a peak having the greatest absorption coefficient. Regarding the measurement, a chloroform solution in which the first organic compound was produced, and the absorption spectrum was measured by a spectrophotometer (JASCO Corporation Ubest-550). The maximum absorption peak wavelength and the absorbance were determined on the basis of the measurement results. The molar absorptivity was determined from the absorbance in accordance with Lambert-Beer law.

TABLE 9

| Exemplary compound | Absorption peak wavelength in chloroform solution [nm] | Molar absorptivity [$M^{-1}$ $cm^{-1}$] |
|---|---|---|
| 1-6 | 551 | 44000 |
| 1-7 | 569 | 65670 |
| 1-8 | 568 | 46127 |

TABLE 9-continued

| Exemplary compound | Absorption peak wavelength in chloroform solution [nm] | Molar absorptivity [M$^{-1}$ cm$^{-1}$] |
| --- | --- | --- |
| 1-13 | 584 | 51210 |
| 1-21 | 535 | 49880 |
| 1-22 | 532 | 42550 |
| e-1 | 520 | 67610 |

As is clear from example 53 and comparative example 18, the compound denoted by general formula [28] can obtain an absorption peak suitable for obtaining a panchromatic absorption band in the visible range and strong absorption with molar absorptivity of 40,000 or more. Strong absorption is associated with a high external quantum yield and, therefore, is important factor for the photoelectric conversion element.

Example 54

A photoelectric conversion element was produced in the same manner as example 1 except that a silicon nitride layer by using a CVD method was used as the sealing layer. The silicon nitride layer having a layer thickness of 1 µm was formed. Durability was evaluated by irradiating the resulting element with LED light of 365 nm at intensity of 1 W/cm$^2$ for 24 h.

The absorptance of the LED light of 365 nm by the resulting SiN (1 µm) was 75%. The value of dark current in this element did not change even after a lapse of 24 h.

On the other hand, regarding the photoelectric conversion element produced in example 1, the dark current about 10% increased after light irradiation for 24 hours. This is because the glass cap has lower ultraviolet absorptance than SiN. In consideration of this, it is preferable that the sealing layer be formed of a material that can absorb ultraviolet rays.

Example 55

Figure 6:
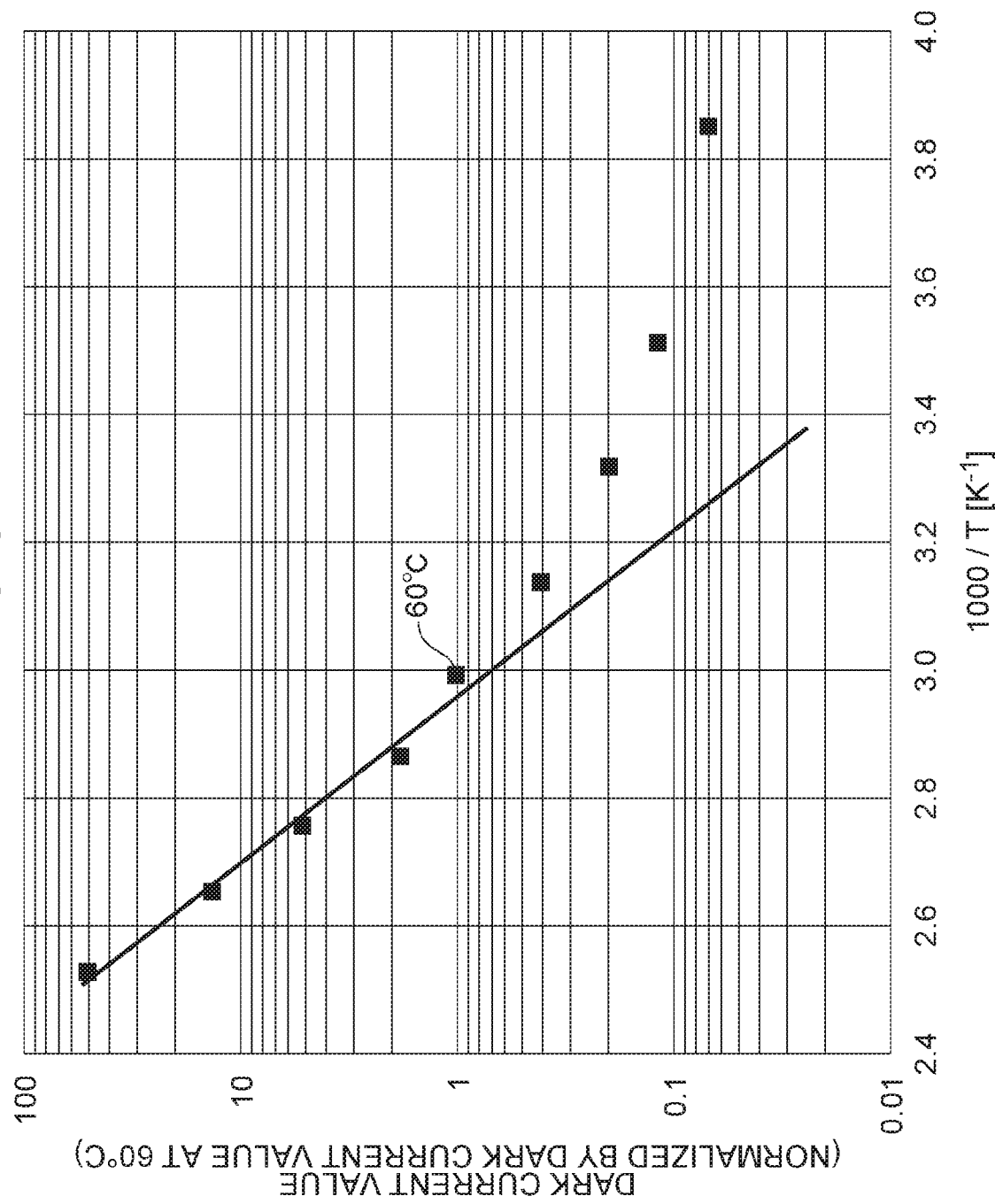
FIG. 6 is a diagram showing the Arrhenius plot of dark current values of a photoelectric conversion element containing an organic compound according to the present invention.

The photoelectric conversion element produced in example 1 was used, and the temperature dependence of dark current was measured. FIG. 6 is a diagram showing the Arrhenius plot of the photoelectric conversion element in example 1. The vertical axis indicates the dark current value normalized by the dark current value at 60° C. The vertical axis is graduated in common logarithms. The horizontal axis indicates the reciprocal of absolute temperature. The absolute value of the gradient increases as the temperature increases from about 60° C. The activation energy was determined from this gradient on the basis of formula (5) below.

$$\ln J(T) = -\frac{E_a}{k_B}\frac{1}{T} + \ln J_0 \quad (5)$$

In this regard, T represents absolute temperature, $k_B$ represents Boltzmann constant, $E_a$ represents activation energy, J represents a current value at temperature T, and $J_0$ represents a frequency factor. The dark current activation energy determined from the gradient was 0.84 eV.

Example 56

Figure 7:
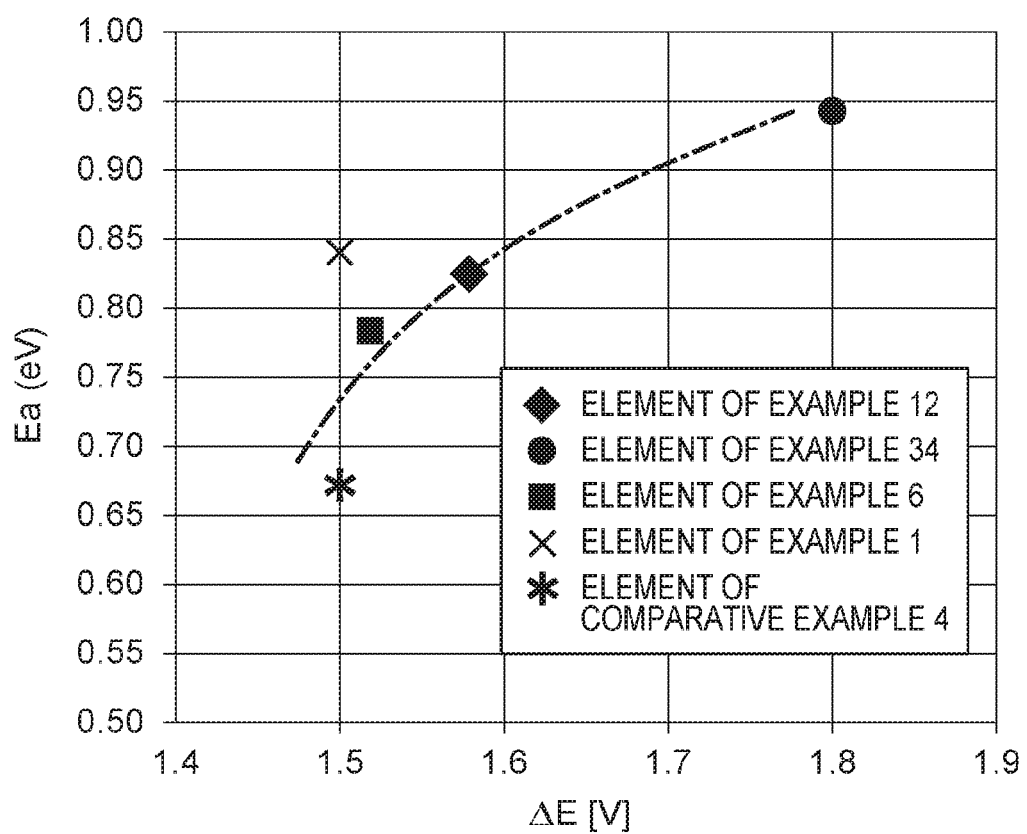
FIG. 7 is a diagram showing the relationship between the activation energy ($E_a$) of dark current in a photoelectric conversion element using an exemplary compound and $\Delta E$ of the photoelectric conversion element.

Regarding each of the photoelectric conversion elements produced in examples 2, 6, 12, and 34 and comparative example 6, the activation energy was determined in the same method as example 55 and was plotted relative to corresponding ΔE as shown in FIG. 7. It is shown that the activation energy tends to increase as ΔE increases. As is clear from FIG. 7, when ΔE is 1.5 V or more, the activation energy is high. This indicates that when ΔE is 1.5 V or more, a probability of charge generation due to thermal excitation is reduced. In this regard, Table 10 shows the relationship between the activation energy and the dark current evaluation. As shown in Table 10, when the activation energy is 0.70 eV or more, the rating of dark current is C or better.

That is, for the purpose of reducing dark current, it is preferable that the activation energy of dark current be 0.70 eV or more.

TABLE 10

| | Activation energy [eV] | Rating of dark current |
| --- | --- | --- |
| Example 1 | 0.84 | C |
| Example 6 | 0.78 | C |
| Example 12 | 0.83 | C |
| Example 34 | 0.95 | A |
| Comparative example 1 | 0.68 | E |

Consequently, the photoelectric conversion element according to the present invention is a photoelectric conversion element in which dark current is reduced. An image pickup element including the photoelectric conversion element is preferable because dark current noise resulting from the photoelectric conversion element portion is at a low level.

According to the present invention, a photoelectric conversion element in which dark current is reduced can be provided.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:

1. A photoelectric conversion element comprising:
an anode;
a cathode; and
a photoelectric conversion layer disposed between the anode and the cathode,
wherein the photoelectric conversion layer contains a first organic compound and a second organic compound, the oxidation potential of the first organic compound is lower than the oxidation potential of the second organic compound, ΔE denoted by formula (A) below satisfies formula (B) below, ΔE=oxidation potential of first organic compound− reduction potential of second organic compound (A)

ΔE≥1.5 [V] (B)

and the first organic compound is denoted by formula [28] below,

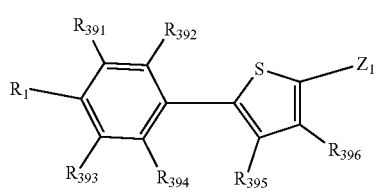

in formula [28], $R_{391}$ to $R_{393}$, and $R_{396}$ are selected from the group consisting of a hydrogen atom, a halogen atom, a substituted or unsubstituted alkyl group, a substituted or unsubstituted alkoxy group, a substituted or unsubstituted aryl group, a substituted or unsubstituted heterocyclic group, a substituted or unsubstituted vinyl group, a substituted or unsubstituted amino group, and a cyano group, wherein $R_{394}$ and $R_{395}$ form a ring by bonding to each other, $R_{391}$ and $R_{392}$ may form a ring by bonding to each other, and $R_1$ and $R_{391}$ do not form a ring by bonding to each other, wherein in general formula [28], $R_1$ represents a hydrogen atom, a halogen atom, a substituted or unsubstituted alkyl group, a substituted or unsubstituted alkoxy group, a substituted or unsubstituted aryl group, a substituted or unsubstituted heterocyclic group, a substituted or unsubstituted vinyl group, a substituted or unsubstituted amino group, or a cyano group, wherein $Z_1$ represents any substituent denoted by general formulae [1-1] to [1-9] below, and wherein in general formulae [1-1] to [1-9], each of $R_{521}$ to $R_{588}$ is selected from a hydrogen atom, a halogen atom, a substituted or unsubstituted alkyl group, a substituted or unsubstituted alkoxy group, a substituted or unsubstituted aryl group, a substituted or unsubstituted heterocyclic group, a substituted or unsubstituted vinyl group, a substituted or unsubstituted amino group, and a cyano group,

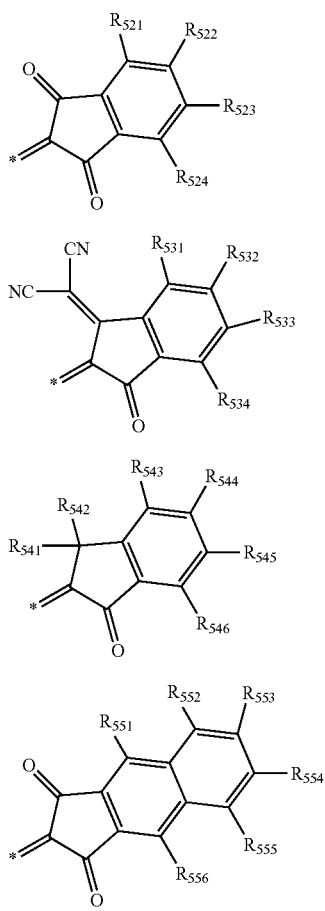

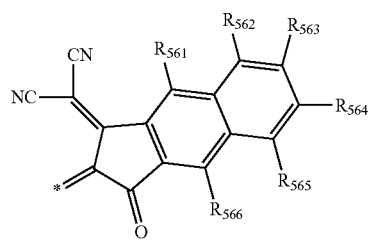

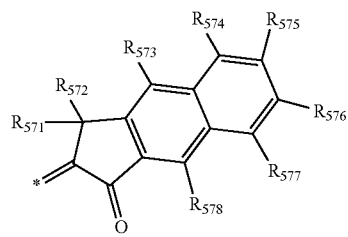

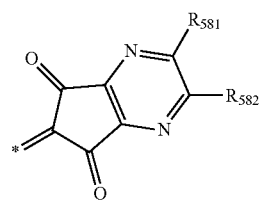

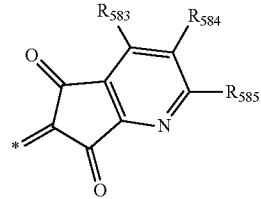

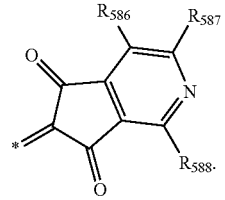

2. The photoelectric conversion element according to claim 1, wherein activation energy of dark current is 0.70 eV or more.

3. The photoelectric conversion element according to claim 1, wherein the absorption peak wavelength of the first organic compound is 530 nm or more.

4. The photoelectric conversion element according to claim 1, wherein the oxidation potential of the first organic compound is 0.65 V or more.

5. The photoelectric conversion element according to claim 1, wherein the second organic compound is a fullerene derivative.

6. The photoelectric conversion element according to claim 5, wherein the fullerene derivative is fullerene C60.

7. The photoelectric conversion element according to claim 1, wherein a sealing layer is included on the anode.

8. An image pickup element comprising:
a plurality of pixels; and
a signal processing circuit connected to the pixels, wherein each of the pixels includes the photoelectric conversion element according to claim 1 and a reading circuit connected to the photoelectric conversion element.

9. An image pickup apparatus comprising:
an optical portion including a plurality of lenses; and
an image pickup element that receives light passing through the optical portion,
wherein the image pickup element is the image pickup element according to claim 8.

10. The image pickup apparatus according to claim 9, further comprising a receiving portion that receives a signal from outside.

11. The image pickup apparatus according to claim 10, wherein the signal is a signal that controls at least one of an image pickup range, start of image pickup, and finish of image pickup of the image pickup apparatus.

12. The image pickup apparatus according to claim 9, further comprising a sending portion that sends an acquired image to outside.

13. The photoelectric conversion element according to claim 1,
wherein the ring formed by $R_{394}$ and $R_{395}$ is a five member ring.

* * * * *